United States Patent
Eum et al.

(10) Patent No.: US 11,782,348 B2
(45) Date of Patent: *Oct. 10, 2023

(54) APPARATUS FOR TREATING SUBSTRATE

(71) Applicant: SEMES CO., LTD., Cheonan-si (KR)

(72) Inventors: Ki Sang Eum, Cheonan-si (KR); Gyeong Won Song, Cheonan-si (KR); Yang Yeol Ryu, Cheonan-si (KR); Kyung Jin Seo, Asan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/531,988

(22) Filed: Nov. 22, 2021

(65) Prior Publication Data
US 2022/0163892 A1 May 26, 2022

(30) Foreign Application Priority Data
Nov. 23, 2020 (KR) .................. 10-2020-0157849

(51) Int. Cl.
*G03F 7/16* (2006.01)
*B05C 15/00* (2006.01)
*B05C 11/02* (2006.01)

(52) U.S. Cl.
CPC .............. *G03F 7/162* (2013.01); *B05C 11/02* (2013.01); *B05C 15/00* (2013.01)

(58) Field of Classification Search
USPC .......................... 118/52, 612, 319, 320, 326
See application file for complete search history.

(56) References Cited

U.S. PATENT DOCUMENTS 6,527,860 B1 * 3/2003 Yoshihara ........... H01L 21/6715
118/62
2015/0155197 A1 * 6/2015 Tachibana ............... G03F 7/162
438/782

FOREIGN PATENT DOCUMENTS

| JP | 2000-237669 A | 9/2000 |
| JP | 2002-066428 A | 3/2002 |
| JP | 10-2009-0056805 A | 6/2009 |
| KR | 1019990077743 A | 10/1999 |
| KR | 1020010050979 A | 6/2001 |
| KR | 1020180121867 A | 11/2018 |
| KR | 1020200027161 A | 3/2020 |

OTHER PUBLICATIONS

Korean Patent Office, Office action dated Oct. 27, 2022.

* cited by examiner

*Primary Examiner* — Yewebdar T Tadesse
(74) *Attorney, Agent, or Firm* — Li & Cai Intellectual Property (USA) Office

(57) ABSTRACT

The inventive concept provides an apparatus for treating a substrate. The apparatus comprises a processing container having an inner space; a support unit configured to support and rotate the substrate in the inner space; a liquid supply unit configured to supply a treating liquid to the substrate supported by the support unit; and an exhaust unit configured to exhaust an air flow from the inner space, wherein the exhaust unit includes an air flow guide duct with an inlet provided to introduce the air flow into the air flow guide duct in a tangential direction to a rotating direction of the substrate supported on the support unit.

11 Claims, 18 Drawing Sheets

APPARATUS FOR TREATING SUBSTRATE

CROSS-REFERENCE TO RELATED APPLICATIONS

A claim for priority under 35 U.S.C. § 119 is made to Korean Patent Application No. 10-2020-0157849 filed on Nov. 23, 2020, in the Korean Intellectual Property Office, the entire contents of which are hereby incorporated by reference.

BACKGROUND

Embodiments of the inventive concept described herein relate to an apparatus for treating a substrate, and more particularly, relate to an apparatus for treating a substrate by supplying a liquid onto a rotating substrate.

Various processes such as a photolithography process, an etching process, an ashing process, a thin film deposition process, and a cleaning process are carried out to manufacture a semiconductor device or a flat plate display panel. Among these processes, the photolithography process includes supplying a photoresist to a semiconductor substrate to form a photoresist film on a surface of the substrate, exposing the photoresist film using a photomask, and then supplying a developing liquid to selectively remove portions of the photoresist film. These processes are performed in process chambers.

FIG. 1 is a schematic view illustrating a substrate treating apparatus 1 for applying photoresist to a substrate. Referring to FIG. 1, the substrate treating apparatus 1 includes a processing container 10 having an inner space, a support unit 20 for supporting the substrate W in the inner space, and a nozzle 30 for supplying a treating liquid 82 (see FIG. 3) onto the substrate W placed on the support unit 20. The processing container 10 has an outer cup 12 and an inner cup 14. Furthermore, a fan filter unit (not shown) for supplying a downward air flow into the inner space is disposed over the processing container 10, and a drain pipe 60 for draining the treating liquid and an exhaust pipe 70 for exhausting an atmosphere in a treating space are connected to a lower region of the inner space.

When the substrate treating apparatus 1 having the structure illustrated in FIG. 1 treats the substrate W while supplying the treating liquid on the rotating substrate W, an air flow on the surface of the substrate W flows from the center of the substrate W toward the edge thereof along the rotating direction of the substrate W by the centrifugal force as illustrated in FIG. 2. Thereafter, as illustrated in FIG. 3, the air flow flows downward after colliding with the outer cup 12 and is exhausted from the inner space to the outside through the exhaust pipe 70. As the direction of the air flow is changed from the horizontal direction to the vertical direction, the air flow collides with the outer cup 12, and a vortex is generated at the point where the air flow collides with the outer cup 12. The air flow is stagnant at the point where the vortex is generated, and the inner space is not smoothly exhausted accordingly. The problem is further intensified as the rotating speed of the substrate W is increased.

The vortex and the stagnant air flow at the collision point hamper the air flow over the edge region of the substrate W when a film of the treating liquid is formed on the substrate W. Due to this, the thickness of the thin film on the edge region of the substrate W is greater than the thickness of the thin film on the central region of the substrate W. Furthermore, due to the vortex at the collision point, contaminants such as fumes flow back to the substrate W to contaminate the substrate W.

SUMMARY

Embodiments of the inventive concept provide a substrate treating apparatus for improving efficiency in treating a substrate.

Embodiments of the inventive concept provide a substrate treating apparatus for smoothly exhausting an air flow in a treating space when treating a substrate by supplying a treating liquid onto the rotating substrate in the treating space.

Embodiments of the inventive concept provide a substrate treating apparatus for forming a liquid film having a uniform thickness on the entire region of a substrate by supplying a treating liquid onto the rotating substrate.

Embodiments of the inventive concept provide a substrate treating apparatus for preventing re-adsorption of contaminants to a substrate when treating the substrate by supplying a treating liquid onto the rotating substrate.

The technical problems to be solved by the inventive concept are not limited to the aforementioned problems, and any other technical problems not mentioned herein will be clearly understood from the following description by those skilled in the art to which the inventive concept pertains.

An embodiment of the inventive concept provides a substrate treating apparatus.

The apparatus comprises a processing container having an inner space; a support unit configured to support and rotate the substrate in the inner space; a liquid supply unit configured to supply a treating liquid to the substrate supported by the support unit; and an exhaust unit configured to exhaust an air flow from the inner space, wherein the exhaust unit includes an air flow guide duct with an inlet provided to introduce the air flow into the air flow guide duct in a tangential direction to a rotating direction of the substrate supported on the support unit.

In an embodiment, the air flow guide duct is provided in plural with being spaced apart from each other along a circumferential direction of the substrate supported by the support unit.

In an embodiment, the processing container comprises an outer cup surrounding the substrate supported by the support unit, and the air flow guide duct is installed at an inner wall of the outer cup.

In an embodiment, the support unit comprises a support plate configured to support the substrate; a rotary shaft configured to rotate the support plate; and an actuator coupled to the rotary shaft and configured to provide torque to the rotary shaft, wherein the processing container comprises an outer cup configured to provide the inner space; and an inner cup disposed in the inner space so as to be spaced apart from the outer cup, and configured to surround the rotary shaft or the actuator, and wherein the air flow guide duct is provided between the outer cup and the inner cup.

In an embodiment, a length of the air flow guide duct extends vertically.

In an embodiment, the length of the air flow guide duct comprises an upper wall and a side wall, wherein the upper wall serves as a blocking face, and among the side wall the inlet is provided at a wall facing a direction parallel to a tangent line of the substrate supported by the support unit, and the remaining face may serve as a blocking face.

In an embodiment, the inner cup defines an exhaust space under the support plate, and the exhaust unit further includes an individual exhaust pipe for exhausting an air flow introduced into the exhaust space to the outside of the inner space.

In an embodiment, the exhaust unit further includes an integrated exhaust pipe located outside the processing container and provided with a pressure controlling member, and the individual exhaust pipe and the air flow guide duct are connected to the integrated exhaust pipe.

In an embodiment, the air flow guide duct comprises an upper wall and a sidewall, and the sidewall comprises: a first side face adjacent an inner face of the outer cup; a second side face adjacent the substrate placed on the support unit; and a third side surface facing the tangent direction to the rotating direction of the substrate, and the inlet is formed at the third side surface.

In an embodiment, the second side surface extends from the second side face and away from a rotation axis of the support unit as it moves away from the inlet.

In an embodiment, the substrate processing apparatus further includes a liquid supply nozzle for supplying a photoresist to the substrate supported by the support unit.

A substrate treating apparatus according to another aspect of the inventive concept is provided.

The apparatus comprises a processing container having an inner space; a support unit configured to support and rotate the substrate in the inner space; a liquid supply unit configured to supply treating liquid to the substrate supported by the support unit; and an exhaust unit configured to exhaust an air flow in the inner space, wherein the exhaust unit comprises: an exhaust pipe for exhausting an air flow of a first path, which is a path flowing into an exhaust space located below the support plate in the inner space, to the outside of the processing container through a space between an inner wall of the processing container and the substrate supported on the support plate; and an air flow guide duct located in the inner space and guiding the air flow to a second path which is a path in a tangential direction to a rotating direction of the substrate supported by the support unit.

In an embodiment, the support unit comprises a rotary shaft configured to rotate the support plate; and an actuator coupled to the rotary shaft and configured to provide torque to the rotary shaft, wherein the processing container comprise an outer cup configured to provide the inner space; and an inner cup disposed in the inner space to be spaced apart from the outer cup, and configured to surround the rotary shaft or the actuator, and wherein the air flow guide duct is provided between the outer cup and the inner cup.

In an embodiment, the exhaust unit further includes an integrated exhaust pipe located outside the processing container and provided with a pressure controlling member, and the air flow guide duct is connected to the integrated exhaust pipe.

In an embodiment, the integrated exhaust pipe comprises an air flow introduction part through which an air flow released from the air flow guide duct is introduced; an air flow discharge part through which an air flow introduced into the air flow introduction part is discharged to the outside; and a gas-liquid separator for separating the air flow and the treating liquid from the air flow introduced into the air flow introduction part, wherein the gas-liquid separator is provided to protrude from the bottom surface of the air flow introduction part and to be spaced apart from an upper surface of the air flow introduction part.

In an embodiment, the air flow guide duct comprises an upper wall and a sidewall, and an inlet formed at the sidewall to introduce an air flow in a tangential direction to a rotating direction of the substrate supported by the support unit, and the side wall comprises: a first side face adjacent an inner face of the outer cup; a second side face adjacent the substrate placed on the support unit; a third side surface between the first side face and the second side face, the third side face defining substantially flat plane oriented in a radial direction of the substrate placed on the support unit, and the inlet being formed in the third side face.

In an embodiment, the second side face extends from the second side face and away from a rotation axis of the support unit as it moves away from the inlet.

A substrate treating apparatus according to another aspect of the inventive concept is provided.

The apparatus comprises a processing container having an inner space; a support unit configured to support and rotate the substrate in the inner space; a liquid supply unit configured to supply treating liquid to the substrate supported by the support unit; and an exhaust unit configured to exhaust an air flow in the inner space, wherein the exhaust unit includes an air flow guide duct with an inlet provided into which the air flow is introduced in a tangential direction to a rotating direction of the substrate supported on the support unit, and support unit comprises a rotary shaft configured to rotate the support plate; and an actuator coupled to the rotary shaft and configured to provide torque to the rotary shaft, and the processing container comprises an outer cup configured to provide the inner space; and an inner cup disposed in the inner space so as to be spaced apart from the outer cup, and configured to surround the rotary shaft or the actuator, and wherein the air flow guide duct is provided between the outer cup and the inner cup.

In an embodiment, the exhaust unit further comprises an exhaust pipe for guiding and releasing the air flow in a path different from the path in the tangent direction of the substrate, and the exhaust pipe is provided at a position closer to the inner cup than the air flow guide duct, the exhaust pipe releasing an air flow flowing into an exhaust space located below the support plate in the inner space, to the outside of the processing container through a space between an inner wall of the processing container and the substrate supported on the support plate.

In an embodiment, the air flow guide duct comprises an upper wall and a plurality of sidewalls, and an inlet formed through which an air flow flowing in a tangential direction to the rotating direction of the substrate is formed on a side surface of the plurality of side walls facing a tangential direction to the rotating direction pf the substrate.

According to an embodiment of the inventive concept, the treating liquid is supplied to the substrate rotating in the inner space of the processing container to smoothly exhaust the air flow in the inner space when the substrate is treated.

In addition, according to an embodiment of the inventive concept, when the treating liquid is supplied to the rotating substrate to form a liquid film on the substrate, the thickness of the liquid film may be uniformly formed in the entire region of the substrate.

In addition, according to an embodiment of the inventive concept, it is possible to prevent contaminants from being reattached to the substrate when treating the substrate by supplying a treating liquid to the rotating substrate.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
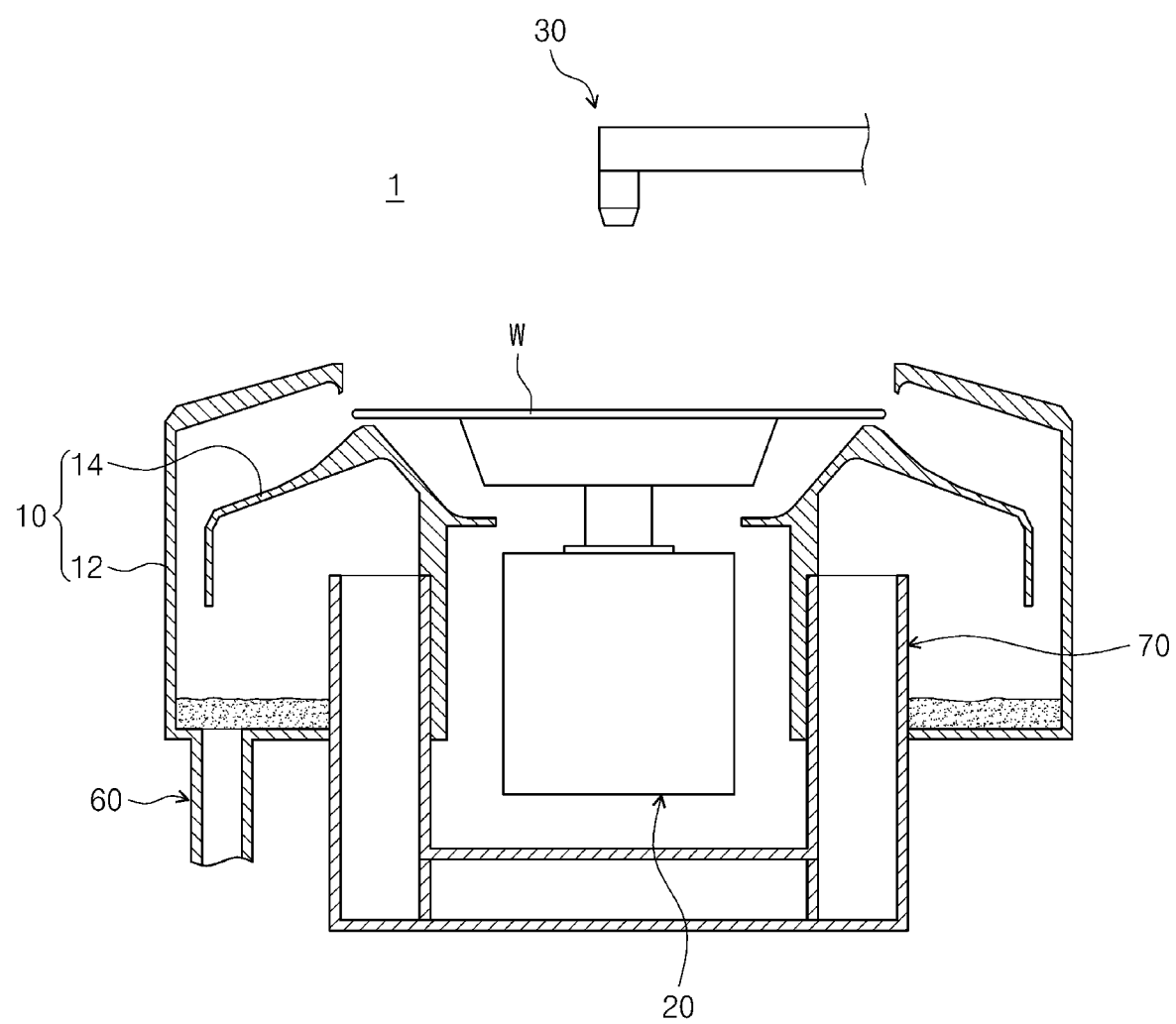
FIG. 1 is a sectional view illustrating a substrate treating apparatus having a general structure for performing liquid treatment on a substrate while rotating the substrate.
Figure 2:
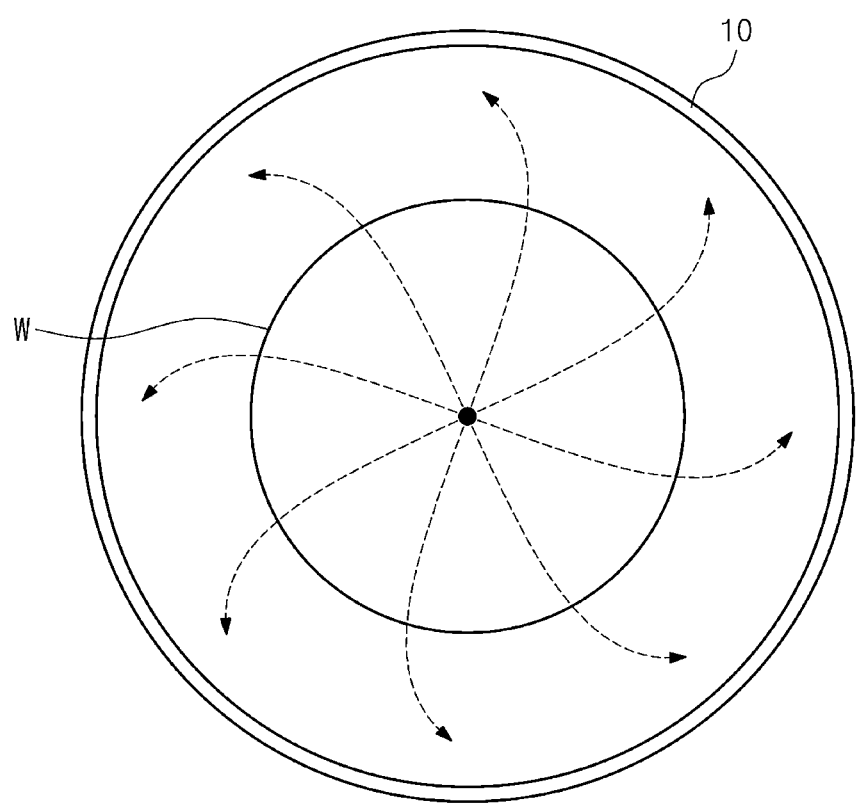
FIG. 2 is a plan view illustrating a direction of an air flow on a surface of the substrate in the substrate treating apparatus of FIG. 1.
Figure 3:
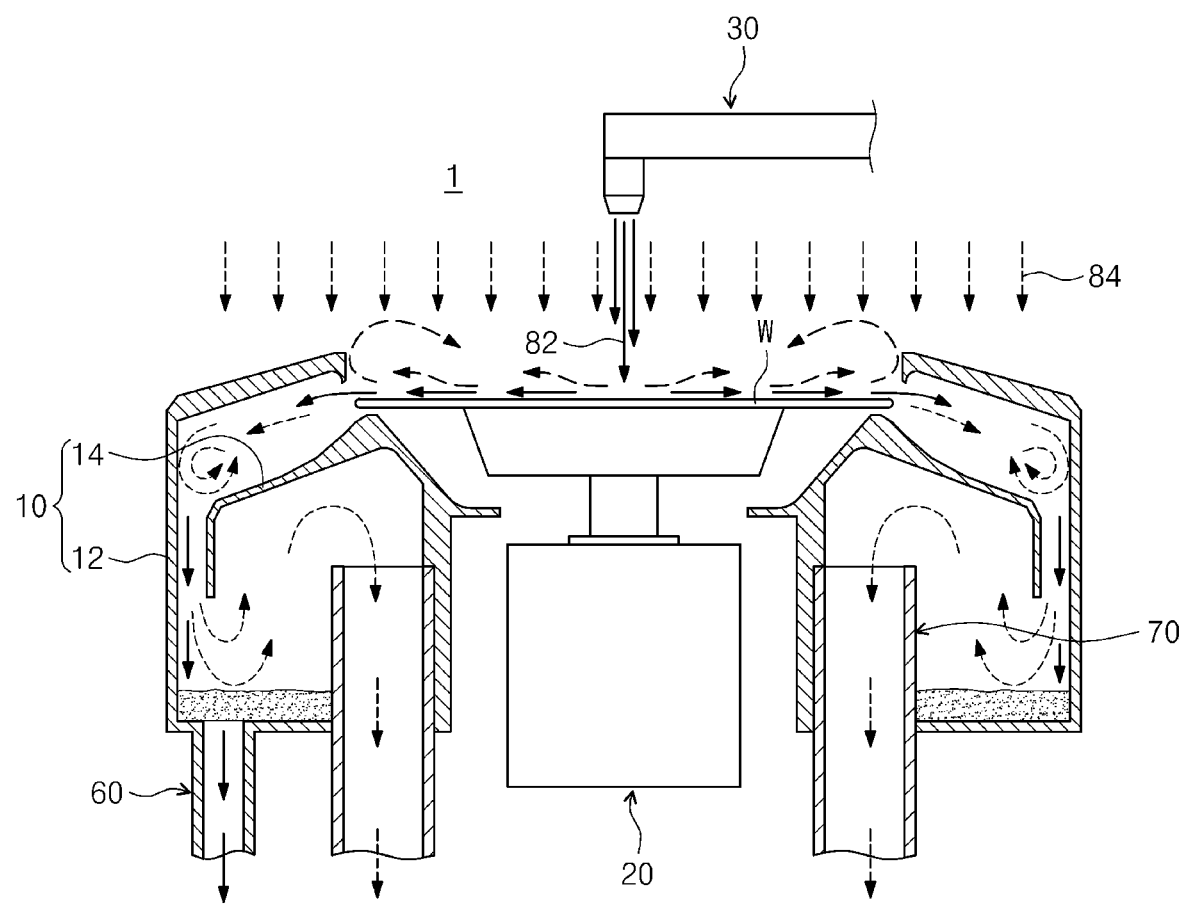
FIG. 3 is a sectional view illustrating the air flow in the substrate treating apparatus of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

An apparatus of exemplary embodiment may be used to perform a photolithography process on a circular substrate. In particular, the apparatus of exemplary embodiment may be connected to an exposure apparatus and may be used to perform a coating process and a developing process on a substrate. However, the spirit and scope of the inventive concept is not limited thereto, and the apparatus may be used to perform various types of processes of supplying a treating liquid onto a substrate while rotating the substrate. In the following description, it will be exemplified that a wafer is used as a substrate.

Hereinafter, embodiments of the inventive concept will be described with reference to FIG. 4 to FIG. 14.

Figure 4:
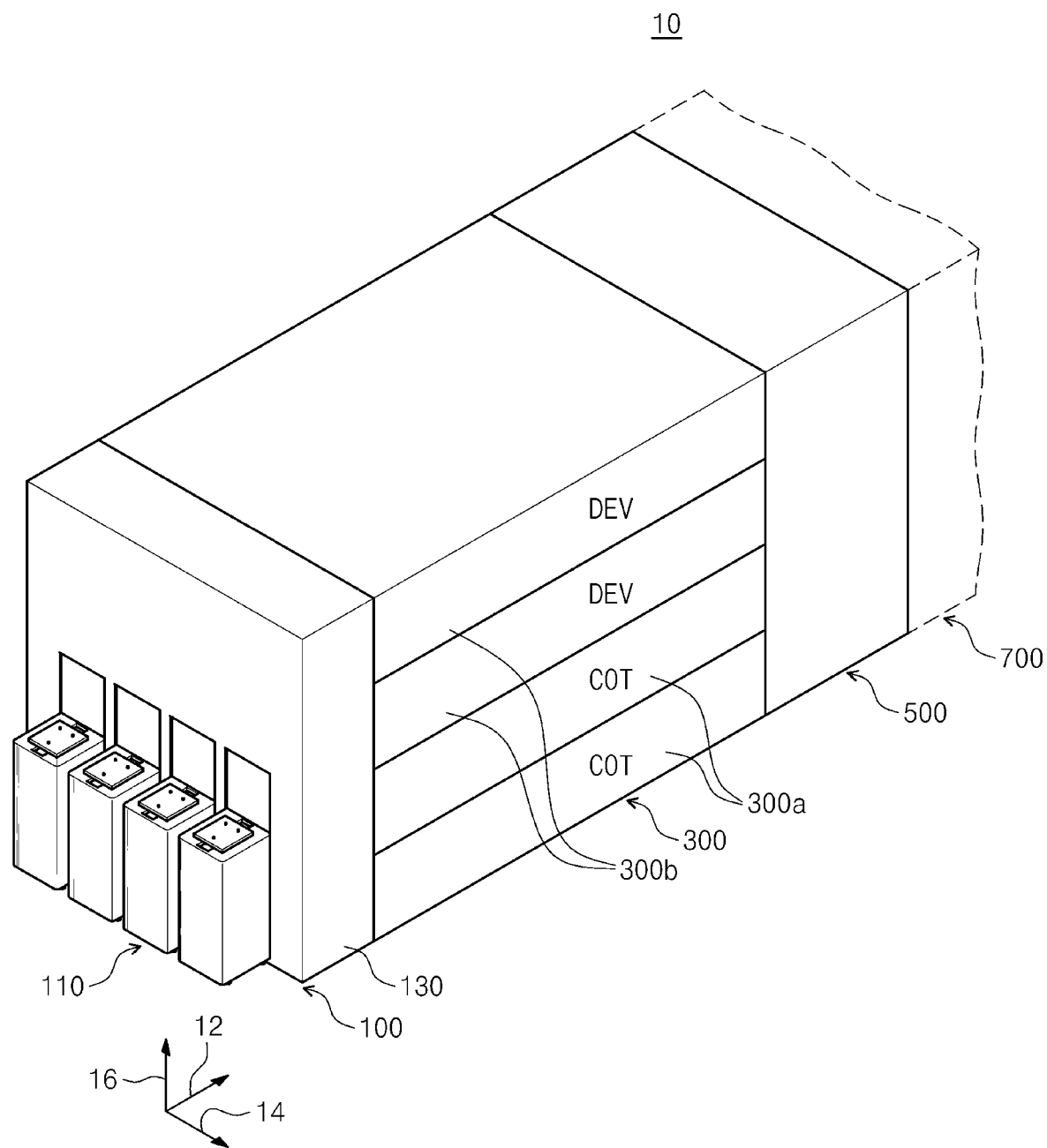
FIG. 4 is a schematic perspective view illustrating a substrate treating apparatus according to an embodiment of the inventive concept.
Figure 5:
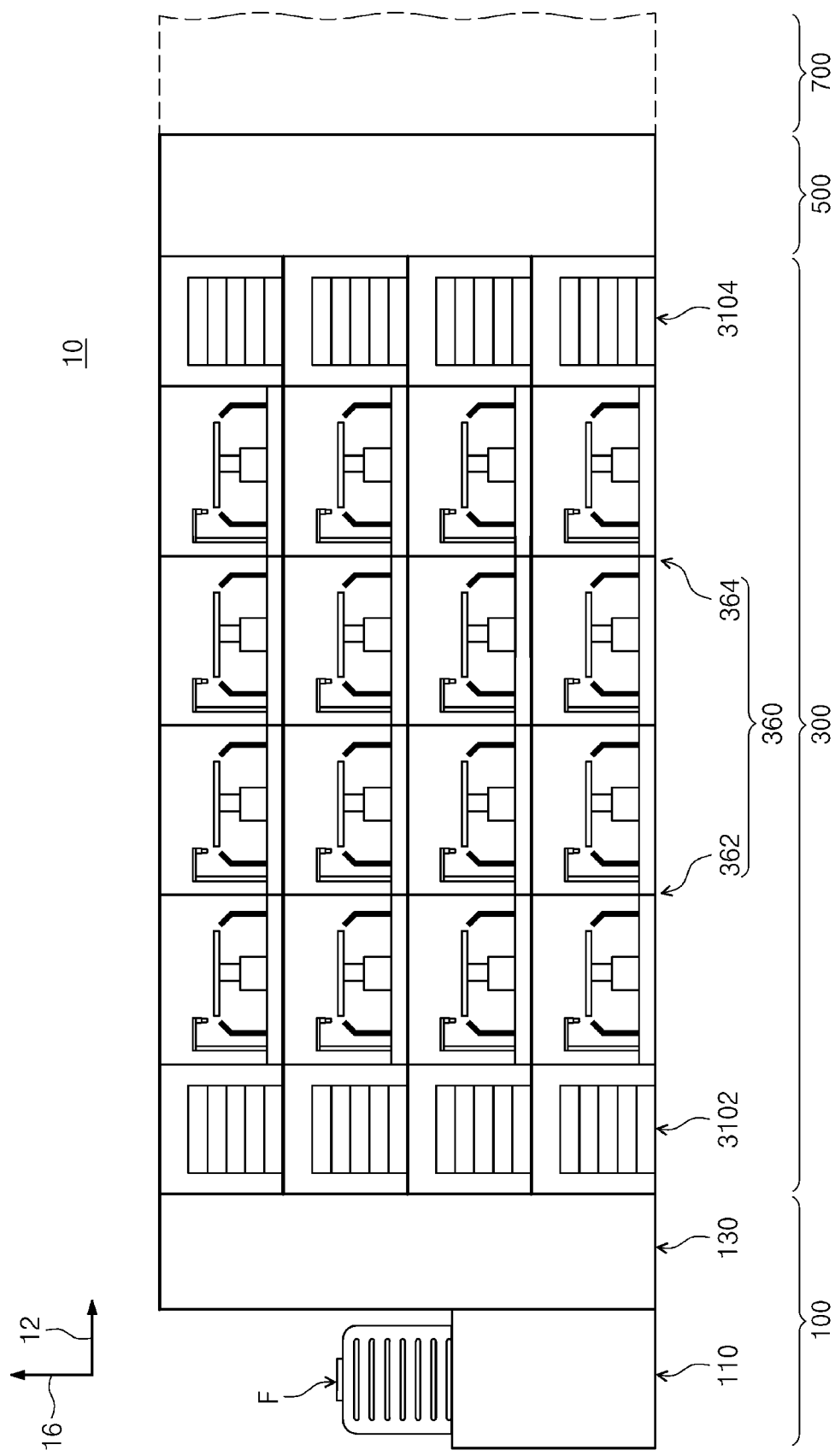
FIG. 5 is a sectional view of the substrate treating apparatus illustrating coating blocks and developing blocks of FIG. 4.
Figure 6:
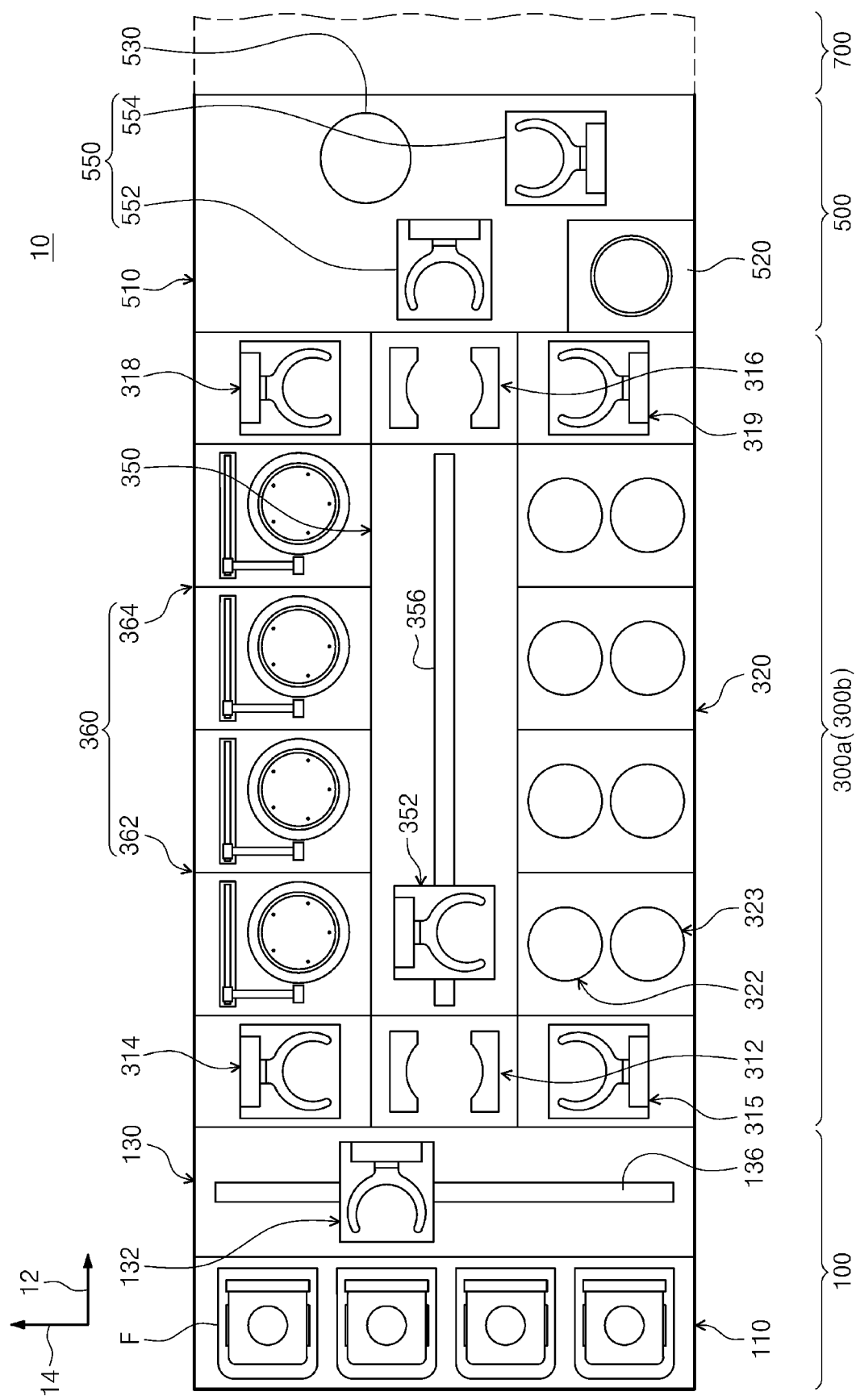
FIG. 6 is a plan view of the substrate treating apparatus of FIG. 1.

FIG. 4 is a schematic perspective view illustrating a substrate treating apparatus according to an embodiment of the inventive concept. FIG. 5 is a sectional view of the substrate treating apparatus illustrating coating blocks and developing blocks of FIG. 4. FIG. 6 is a plan view of the substrate treating apparatus of FIG. 4.

Referring to FIG. 4 to FIG. 6, the substrate treating apparatus 10 according to the embodiment of the inventive concept includes an index module 100, a processing module 300, and an interface module 500. According to an embodiment, the index module 100, the processing module 300, and the interface module 500 are sequentially arranged in a row. Hereinafter, a direction in which the index module 100, the processing module 300, and the interface module 500 are arranged will be referred to as a first direction 12, a direction that is perpendicular to the first direction 12 when viewed from above will be referred to as a second direction 14, and a direction that is perpendicular to both the first direction 12 and the second direction 14 will be referred to as a third direction 16.

The index module 100 transfers substrates W from a container F in which the substrate W is stored to the processing module 300, and gets the processed substrate W from the processing module 300 to be stored in the container F. The index module 100 is provided with its length extending along the second direction 14. The index module 100 has a load port 110 and an index frame 130. The index frame 130 is placed between the load port 110 and the processing module 300. The container F in which the substrates are stored is placed at the load port 110. A plurality of load ports 110 may be provided, and the plurality of load ports 110 may be placed along the second direction 14.

For the container F, a closing-type container such as a front open unified pod (FOUP) may be used. The container F can be placed on the load port 110 by a transfer means (not shown), such as an overhead transfer, an overhead conveyor, or an automatic guided vehicle, or the container F may be placed on the load port 110 by an operator.

An index robot 132 is provided inside the index frame 130. In the index frame 130, a guide rail 136 is provided with its length extending along the second direction 14, and the index robot 132 may be provided movable on the guide rail 136. The index robot 132 includes a hand on which a substrate W is placed, and the hand may be provided to be forwardly and backwardly movable, rotatable with the third direction as an axis, and movable along the third direction 16.

The processing module 300 may perform a coating process and a developing process on the substrate W. The processing module 300 may receive the substrate W stored in the container F and may perform a substrate processing process. The processing module 300 has a coating block 300a and a developing block 300b. The coating block 300a perform a coating process on the substrate W, and the developing block 300b performs a developing process on the substrate W. A plurality of the coating blocks 300a are provided and the plurality of coating blocks 300a are stacked one above another. A plurality of the developing blocks 300b are provided, and the plurality of developing blocks 300b are provided to be stacked one above another. According to the embodiment of FIG. 4, two coating blocks 300a and two developing blocks 300b are provided. The coating blocks 300a may be disposed under the developing blocks 300b. In an embodiment, the two coating blocks 300a may perform the same process and may be provided in the same structure. In addition, the two developing blocks 300b may perform the same process and may have the same structure.

Referring to FIG. 6, each of the coating blocks 300a includes a heat treatment chamber 320, a transfer chamber 350, a liquid treatment chamber 360, and buffer chambers 312 and 316. The heat treatment chamber 320 may be chambers for performing a heat treatment process on the substrate W. The heat treatment process may include a cooling process and a heating process. The liquid treatment chamber 360 supplies liquid onto the substrates W to form a liquid layer. The liquid layer may be a photoresist film or an anti-reflection film. The transfer chamber 350 transfers the substrates W between the heat treatment chamber 320 and the liquid treatment chamber 360 in the coating block 300a.

The transfer chamber 350 is provided with its length parallel to the first direction 12. A transfer robot 352 is provided in the transfer chamber 350. The transfer robot 352 transfers the substrate among the heat treatment chamber 320, the liquid treatment chamber 360, and the buffer chambers 312 and 316. In an embodiment, the transfer robot 352 has a hand on which the substrate W is placed, and the hand may be provided to be forwardly and backwardly movable, rotatable with the third direction 16 as an axis, and movable along the third direction 16. A guide rail 356 is provided in the transfer chamber 350 with its length parallel to the first direction 12, and the transfer robot 352 may be provided to be movable on the guide rail 356.

Figure 7:
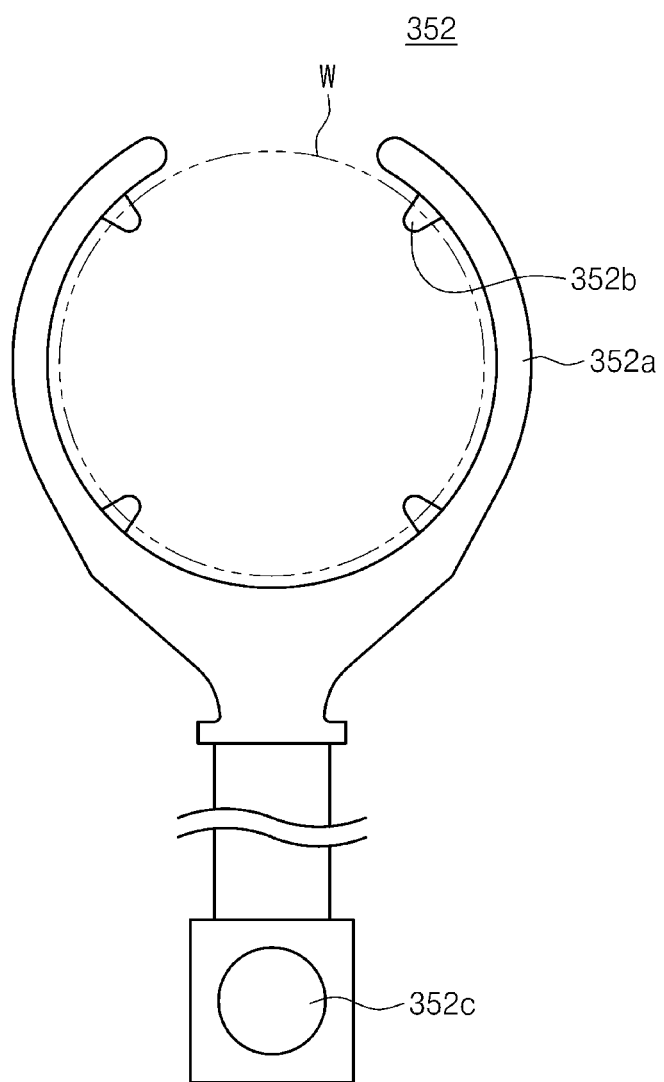
FIG. 7 is a schematic plan view illustrating a transfer robot of FIG. 6.

FIG. 7 is a view illustrating one example of the hand of the transfer robot. Referring to FIG. 7, the hand 352 has a base 352a and support protrusions 352b. The base 352a may have an annular ring shape with the circumference of which being partly cut out. The base 352a has an inner diameter larger than the diameter of a substrate W. The support protrusions 352b extend inward from the base 352a. The support protrusions 352 support an edge region of the substrate W. According to an embodiment, four support protrusions 352 may be provided with being spaced part at equal intervals.

A plurality of heat treatment chambers 320 are provided. The heat treatment chambers 320 are arranged along the first direction 12. The heat treatment chambers 320 are placed on one side of the transfer chamber 350.

Figure 8:
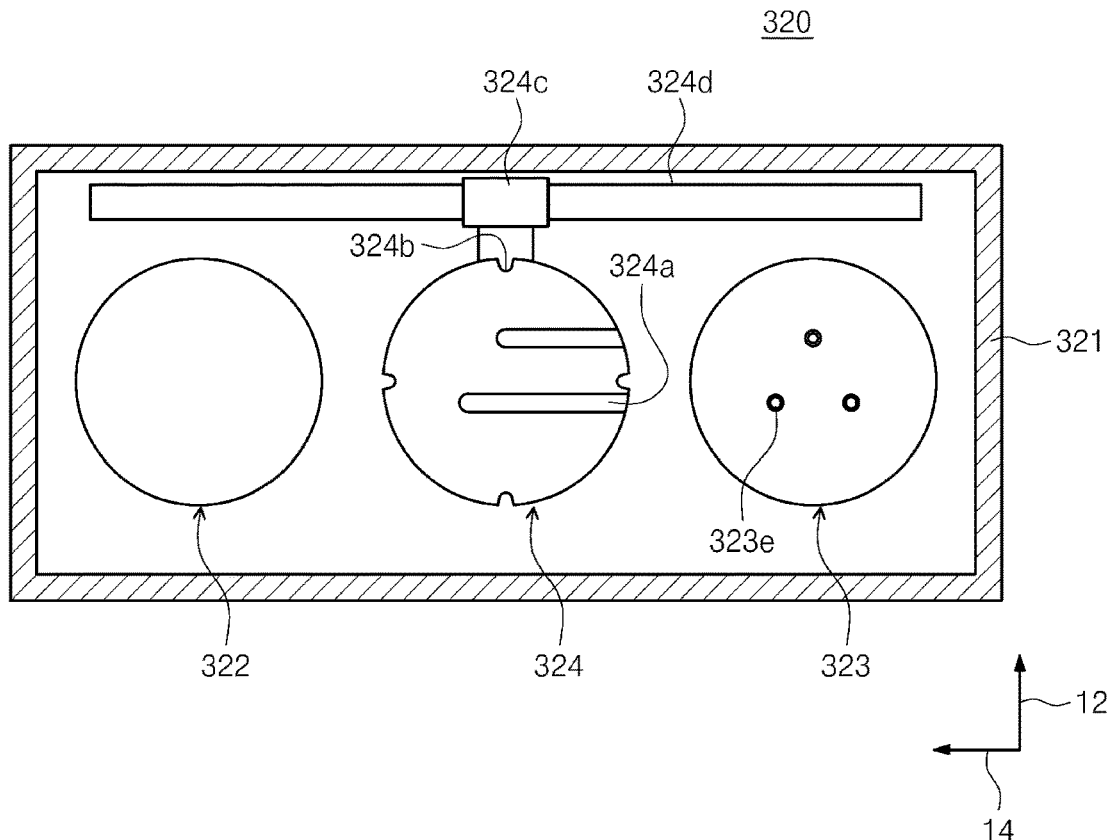
FIG. 8 is a schematic plan view illustrating one example of heat treatment chambers of FIG. 6.
Figure 9:
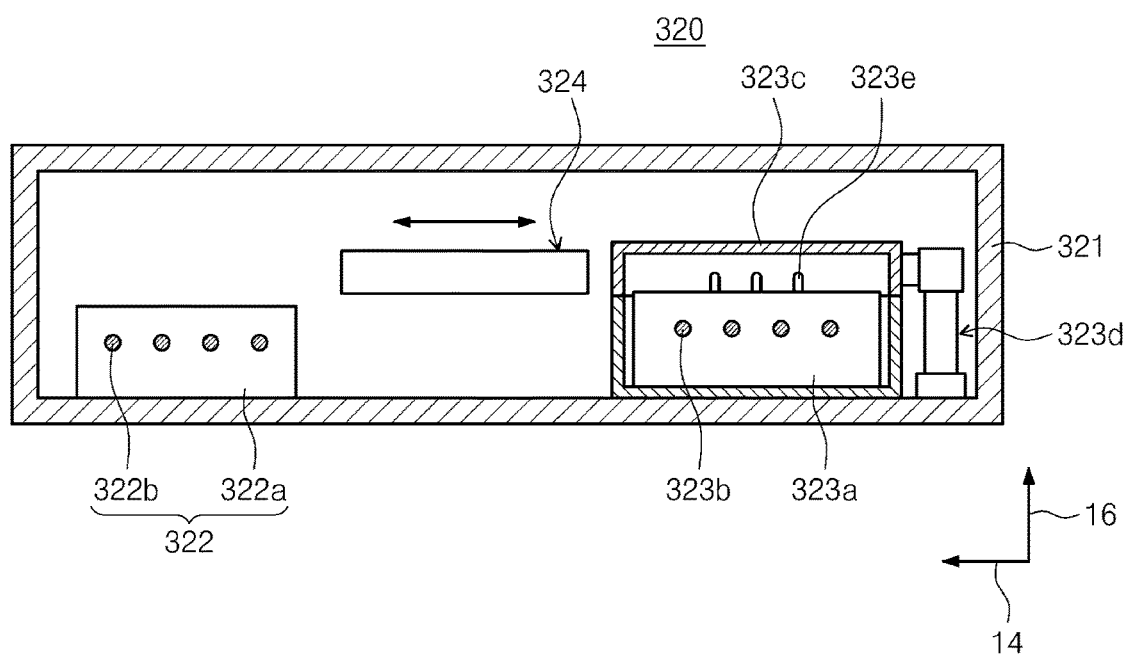
FIG. 9 is a front view of the heat treatment chamber of FIG. 6.

FIG. 8 is a schematic plan view illustrating one example of the heat treatment chambers of FIG. 6, and FIG. 9 is a front view of the heat treatment chamber of FIG. 8.

Referring to FIG. 8 and FIG. 9, the heat treatment chamber 320 has a housing 321, a cooling unit 322, a heating unit 323, and a transfer plate 324.

The housing 321 is provided in a substantially rectangular parallelepiped shape. An inlet (not shown) through which the substrate W enters and exits is provided on the sidewall of the housing 321. The inlet may remain open. Alternatively, a door (not shown) may be provided to open and close the inlet. The cooling unit 322, the heating unit 323, and the transfer plate 324 are provided in the housing 321. The cooling unit 322 and the heating unit 323 are provided side by side along the second direction 14. In an embodiment, the cooling unit 322 may be placed closer to the transfer chamber 350 than the heating unit 323.

The cooling unit 322 has a cooling plate 322a. The cooling plate 322a may have a substantially circular shape when viewed from above. The cooling plate 322a is provided with a cooling member 322b. In an embodiment, the cooling member 322b is formed inside the cooling plate 322a and may be provided as a path through which the cooling fluid flows.

The heating unit 323 has a heating plate 323a, a cover 323c, and a heater 323b. The heating plate 323a has a generally circular shape when viewed from above. The heating plate 323a has a larger diameter than the substrate W. The heating plate 323a is equipped with a heater 323b. The heater 323b may be implemented with a resistance heating element to which an electric current is applied. The heating plate 323a is provided with lift pins 323e that may be vertically movable along the third direction 16. The lift pins 323e receive the substrate W from the transfer means outside the heating unit 323 and place the substrate W down on the heating plate 323a or raise the substrate W off the heating plate 323a and transfer the substrate W to the transfer means outside the heating unit 323. In an embodiment, three lift pins 323e may be provided. The cover 323c has a space therein, which is open at the bottom. The cover 323c is located over the heating plate 323a and is vertically moved by the driver 323d. A space formed together with the heating plate 323a by moving the cover 323c serves as a heating space in which the substrate W is heated.

The transfer plate 324 has a substantially circular shape and has a diameter corresponding to that of the substrate W. A notch 324b is formed at an edge of the transfer plate 324. The notch 324b may have a shape corresponding to the protrusion 352b formed on the hand 354 of the transfer robot 352. In addition, as many notches 324b as the protrusion 352*b* formed on the hand 354 are formed in a position corresponding to the protrusions 352*b*. When the vertical positions of the hand 354 and the transfer plate 324 aligned with each other in the up/down direction are changed, the substrate W is transferred between the hand 354 and the transfer plate 324. The transfer plate 324 may be mounted on the guide rail 324*b* and is movable along the guide rail 324*b* by the driver 324*c*. A plurality of guide grooves 324*a* in a slit shape are provided in the transfer plate 324. The guide grooves 324*a* extend inward from the edge of the transfer plate 324. The guide grooves 324*a* are provided with their length extending along the second direction 14, and the guide grooves 324*a* are located to be spaced apart from each other along the second direction 14. The guide groove 324*a* prevents the transfer plate 324 and the lift pin 323*e* from interfering with each other when the substrate W is handed over between the transfer plate 324 and the heating unit 323.

The substrate W is cooled in a state in which the transfer plate 324 having the substrate W placed thereon is brought into contact with the cooling plate 322*a*. For efficient heat transfer between the cooling plate 322*a* and the substrate W, the transfer plate 324 is formed of a material having high heat conductivity. In an embodiment, the transfer plate 324 may be formed of a metallic material.

The heating unit 320 provided in some of the heat treatment chambers 320 may supply gas while heating the substrate W to improve the adhesion of the photoresist to the substrate W. In an embodiment, the gas may be hexamethyldisilane (HMDS) gas.

A plurality of liquid treatment chambers 360 are provided. Some of the liquid treatment chambers 360 may be stacked on each other. The liquid treatment chambers 360 are located on one side of the transfer chamber 350. The liquid treatment chambers 360 are arranged side by side along the first direction 12. Some of the liquid treatment chambers 360 are located adjacent to the index module 100. Hereinafter, these liquid treatment chambers 360 are referred to as front liquid treatment chambers 362. Some other liquid treatment chambers 360 are located adjacent to the interface module 500. Hereinafter, these liquid treatment chambers 360 are referred to as rear liquid treatment chambers 364.

Each of the front liquid treatment chambers 362 applies a first liquid to the substrate W, and each of the rear liquid treatment chambers 364 applies a second liquid to the substrate W. The first liquid and the second liquid may be different types of liquids. In an embodiment, the first liquid may be a liquid for forming an anti-reflection layer, and the second liquid may be a liquid for forming a photoresist layer. The photoresist liquid may be applied onto the substrate W coated with the anti-reflection film. Alternatively, the first liquid may be a photoresist liquid, and the second liquid may be a liquid for forming an anti-reflection layer. In this case, the liquid for forming the anti-reflection layer may be applied to the substrate W coated with the photoresist layer. Alternatively, the first liquid and the second liquid may be of the same kind of liquid, and both the first liquid and the second liquid may be liquids for forming the photoresist layer.

Hereinafter, a structure of a substrate treating apparatus for treating a substrate by supplying a treating liquid onto the rotating substrate among substrate treating apparatuses of the inventive concept will be described in detail. It will be exemplified that the substrate treating apparatus is an apparatus for applying photoresist. However, the substrate treating apparatus may be an apparatus for forming a film, such as a protective film or an anti-reflection film, on a rotating substrate W. Selectively, the substrate treating apparatus may be an apparatus for supplying a treating liquid 82, such as a developing solution, onto a substrate W.

Figure 10:
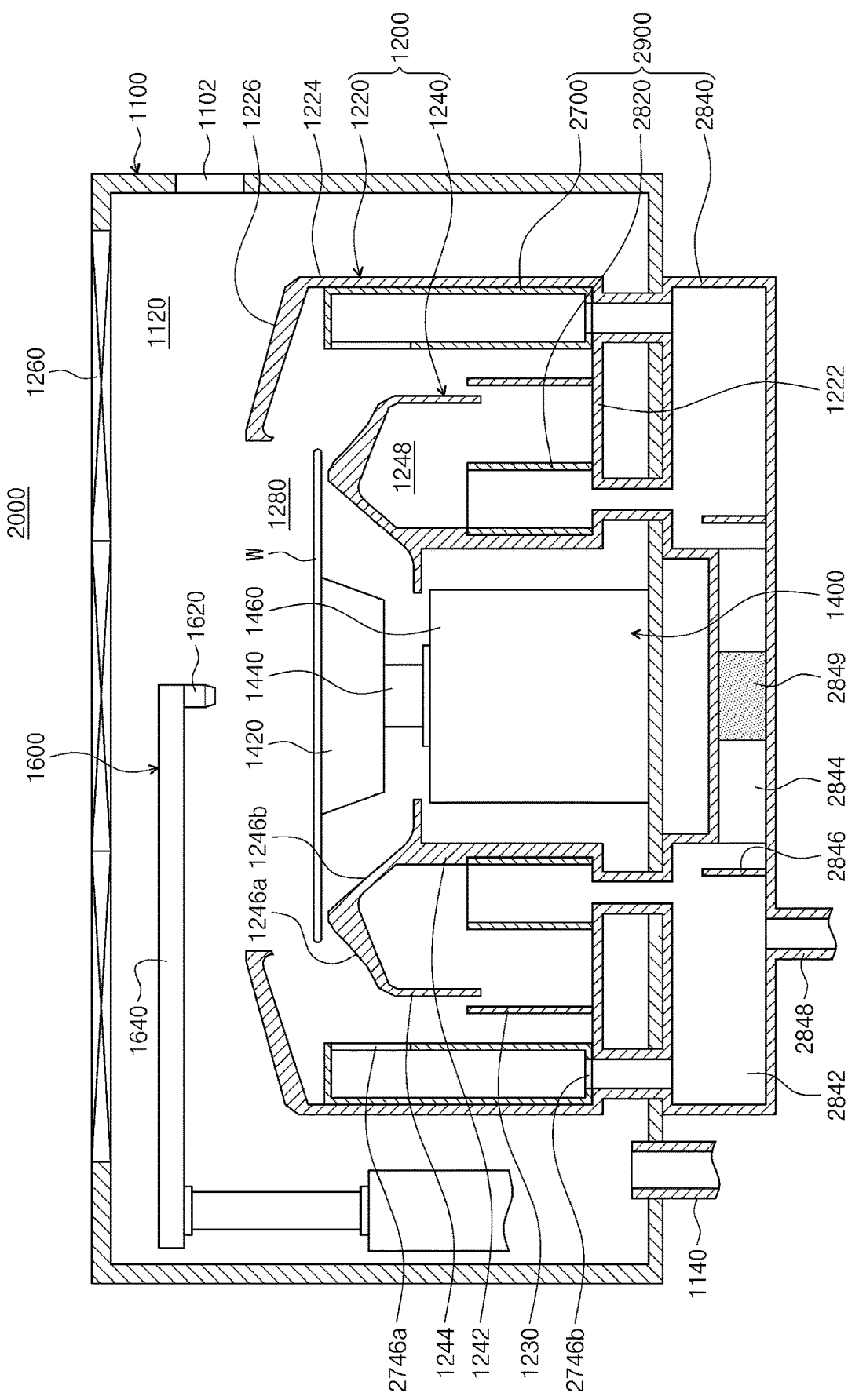
FIG. 10 is a schematic sectional view illustrating a structure of a substrate treating apparatus for treating a substrate by supplying a liquid onto the rotating substrate according to an embodiment of the inventive concept.
Figure 11:
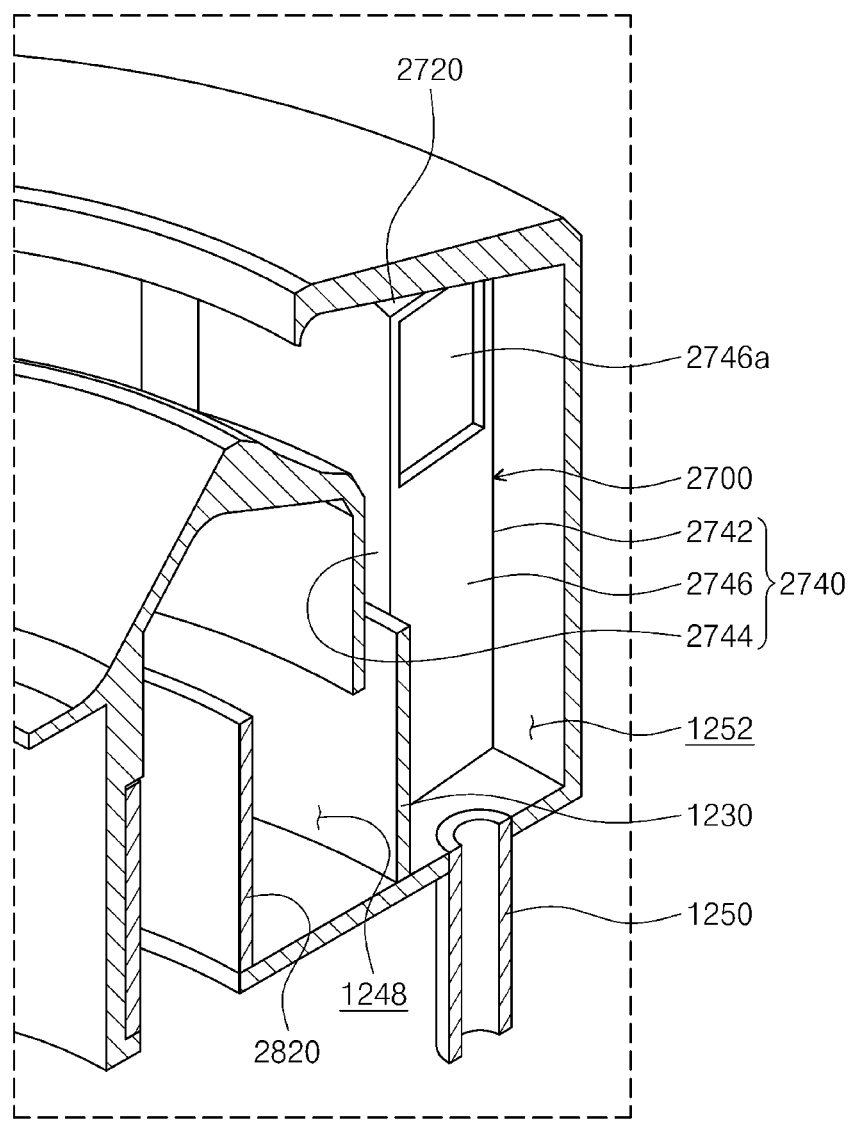
FIG. 11 is a perspective view of the substrate treating apparatus of FIG. 10.
Figure 12:
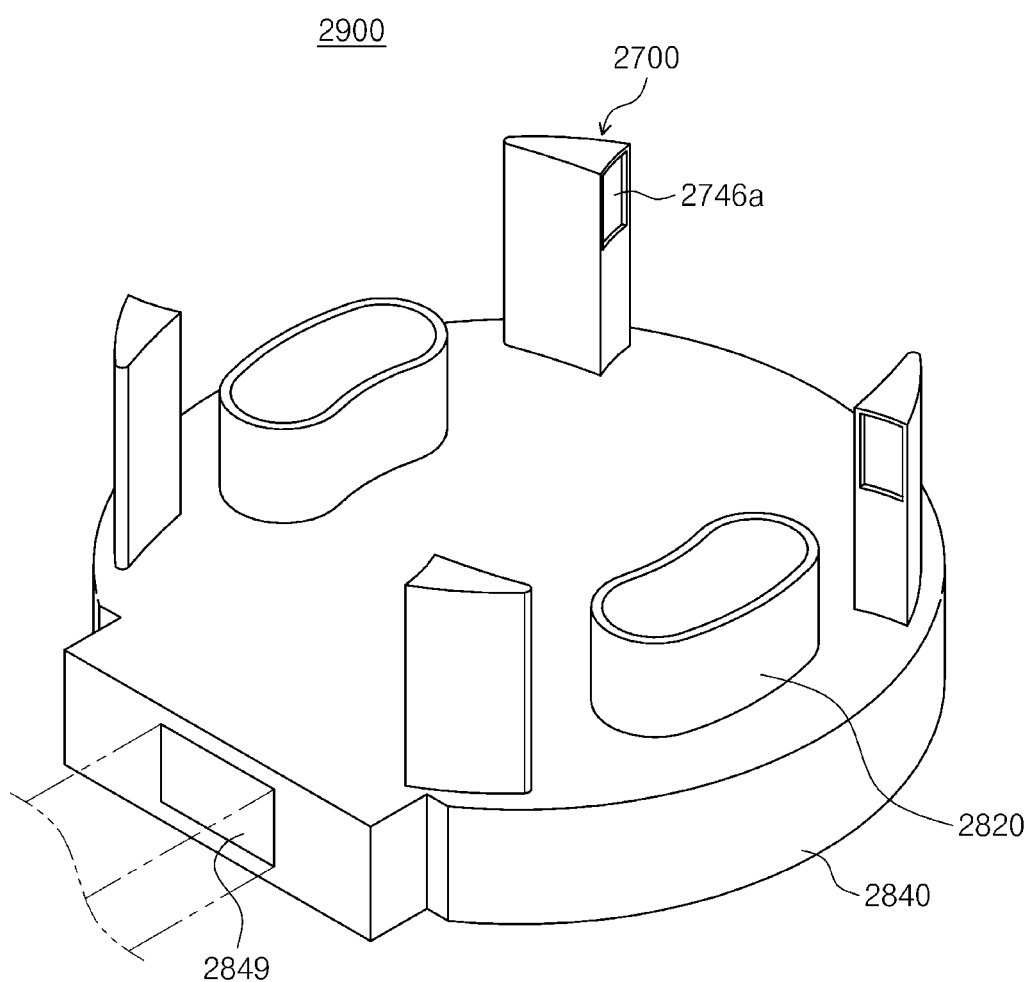
FIG. 12 is a schematic perspective view of a structure of an exhaust unit of FIG. 10.

FIG. 10 to FIG. 12 are views illustrating a substrate treating apparatus 2000 provided with an air flow guide duct 2700 according to a first embodiment of the inventive concept. FIG. 10 is a sectional view illustrating the first embodiment of the substrate treating apparatus, FIG. 11 is a perspective view of the substrate treating apparatus of FIG. 10, and FIG. 12 is a schematic perspective view of a structure of the exhaust unit of FIG. 10.

Referring to FIG. 10 and FIG. 11, the substrate treating apparatus includes a housing 1100, a processing container 1200, a support unit 1400, a liquid supply unit 1600, and an exhaust unit 2900.

The housing 1100 is provided in a rectangular container shape having an inner space 1120. An opening 1102 may be formed in a sidewall of the housing 1100. The opening 1102 may function as an entrance/exit opening through which the substrate W enters or exits the inner space 1120. A door (not shown) may be provided on the sidewall of the housing 1100 to selectively open or close the opening 1102.

The processing container 1200 may be disposed in the inner space 1120 of the housing 1100. The processing container 1200 has an inner space 1280. The inner space 1280 is open at the top.

The substrate support unit 1400 supports the substrate W in the inner space 1280 of the processing container 1200. The substrate support unit 1400 has a support plate 1420, a rotary shaft 1440, and an actuator 1460. The support plate 1420 has a circular upper surface. The support plate 1420 has a smaller diameter than the substrate W. The support plate 1420 supports the substrate W by vacuum pressure. Selectively, the support plate 1420 may have a mechanical clamping structure that supports the substrate W. The rotary shaft 1440 is coupled to the center of the bottom surface of the support plate 1420, and the actuator 1460 providing torque to the rotary shaft 1440 is coupled to the rotary shaft 1440. The actuator 1460 may be a motor.

The liquid supply unit 1600 may supply a treatment liquid 82 onto the substrate W. The processing liquid 82 supplied to the substrate W by the liquid supply unit 1500 may be a coating liquid such as photoresist. The liquid supply unit 1600 has a nozzle 1620, a nozzle moving member 1640, and a liquid supply source (not shown). The nozzle 1620 may include one or more nozzles. The nozzle 1620 dispenses the treating liquid 82 onto the substrate W. The nozzle 1620 is supported on the nozzle moving member 1640. The nozzle moving member 1640 moves the nozzle 1620 between a process position and a standby position. In the process position, the nozzle 1620 supplies the treating liquid 82 onto the substrate W placed on the support plate 1420. After completely supplying the treating liquid 82, the nozzle 1620 stands by in the standby position. In the standby position, the nozzle 1620 stands by in a home port (not shown). The home port is located outward of the processing container 1200 in the housing 1100.

A fan filter unit 1260 is disposed inside an upper wall of the housing 1100 and supplies a downward air flow 84 into the inner space 1120. The fan filter unit 1260 has a fan that introduces outside air into the inner space 1120 and a filter that filters the outside air.

An exhaust pipe 1140 is connected to the housing 1100 so as to be located outward of the processing container 1200 and exhausts, to the outside, the air flow 84 supplied into the space between the processing container 1200 and the housing 1100.

The processing container 1200 has an outer cup 1220 and an inner cup 1240.

The outer cup 1220 surrounds the substrate support unit 1400 and the substrate W supported on the substrate support unit 1400. The outer cup 1220 has a bottom wall 1222, a sidewall 1224, and an upper wall 1226. The inside of the outer cup 1220 is provided as the inner space 1280 described above. The inner space 1280 includes a treating space and an exhaust space 1248 in a lower position than the treating space.

The bottom wall 1222 has a circular shape and has an opening in the center thereof. The sidewall 1224 extends upward from the outside end of the bottom wall 1222. The sidewall 1224 has a ring shape and is perpendicular to the bottom wall 1222. According to an embodiment, the sidewall 1224 extends to a height equal to or slightly lower than the height of the upper surface of the support plate 1420. The upper wall 1226 has a ring shape and has an opening in the center thereof. The upper wall 1226 obliquely extends upward from the upper end of the sidewall 1224 toward the central axis of the outer cup 1220.

The inner cup 1240 is located inside the outer cup 1220. The inner cup 1240 has an inner wall 1242, an outer wall 1244, and an upper wall 1246. The inner wall 1242 has a through-hole formed through the inner wall 1242 in the up/down direction. The inner wall 1242 surrounds the actuator 1460. The inner wall 1242 minimizes exposure of the actuator 1460 to the air flow 84 in the treating space. The rotary shaft 1440 and/or the actuator 1460 of the substrate support unit 1400 extend in the up/down direction through the through-hole. The lower end of the inner wall 1242 may be located at a position corresponding to a position of the bottom wall 1222 of the outer cup 1220. The outer wall 1244 is spaced apart from the inner wall 1242 and surrounds the inner wall 1242. The outer wall 1244 is located to be spaced apart from the sidewall 1224 of the outer cup 1220. The upper wall 1246 connects the upper end of the outer wall 1244 and the upper end of the inner wall 1242. The upper wall 1246 has a ring shape and is disposed to surround the support plate 1420. According to an embodiment, the upper wall 1246 has an upwardly convex shape. The upper wall 1246 has an outer upper wall 1246a obliquely extending upward from the upper end of the outer wall 1244 toward the rotary shaft 1440 and an inner upper wall 1246b obliquely extending downward from the outer upper wall 1246a to the upper end of the inner wall 1242. The support plate 1420 may be located in the space surrounded by the inner upper wall 1246b. According to an embodiment, the highest point of the upper wall 1226 may be located outward of the support plate 1420 and may be located inward of the edge of the substrate W supported on the substrate support unit 1400.

A portion of the treating space under the support plate 1420 may be provided as the exhaust space 1248. According to an embodiment, the exhaust space 1248 may be defined by the inner cup 1240. The space surrounded by the outer wall 1244, the upper wall 1246, and the inner wall 1242 of the inner cup 1240 and/or the space thereunder may be provided as the exhaust space 1248.

A gas-liquid separator 1230 may be provided in the inner space 1280 of the processing container 1200. The gas-liquid separator 1230 may extend upward from the bottom wall 1222 of the outer cup 1220. The gas-liquid separator 1230 may have a ring shape. The gas-liquid separator 1230, when viewed from above, may be located between the sidewall 1224 of the outer cup 1220 and the outer wall 1244 of the inner cup 1240. Optionally, the gas-liquid separator 1230, when viewed from above, may be located to overlap the outer wall 1244 of the inner cup 1240, or may be located inward of the outer wall 1244 of the inner cup 1240. According to an embodiment, the upper end of the gas-liquid separator 1230 may be located in a lower position than the lower end of the outer wall 1244 of the inner cup 1240. Also, the upper end of the gas-liquid separator 1230 may partially overlap with the bottom end of the outer wall 1244 of the inner cup 1240 in a horizontal direction.

A drain pipe 1250 for draining the treating liquid 82 is connected to the bottom wall 1222 of the outer cup 1220. The drain pipe 1250 drains the treating liquid 82 introduced from a space between the sidewall 1224 of the outer cup 1220 and the outer wall 1244 of the inner cup 1240 to outside the processing container 1200. The air flow 84 flowing into the space between the sidewall 1224 of the outer cup 1220 and the outer wall 1244 of the inner cup 1240 is introduced into a space surrounded by the sidewall 1224 and the bottom wall 1222 of the outer cup 1220 and the gas-liquid separator 2846 and is introduced into the exhaust space 1248. In this process, the treating liquid 82 contained in the flow 84 is drained outside the processing container 1200 through the drain pipe 1250, and the air flow 84 is introduced into the exhaust space 1248 of the processing container 1200.

One or more drain pipes 1250 may be provided. When a plurality of drain pipes 1250 are provided, the drain pipes 1250 may be arranged along the circumferential direction of the inner cup 1240.

Although not shown, a lifting actuator for adjusting the height of the outer cup 1220 relative to the support plate 1420 may be provided. According to an embodiment, the lifting actuator may move the outer cup 1220 upward and downward. For example, the support plate 1420 is located in a higher position than the upper end of the outer cup 1220 to prevent interference between a transfer member for transferring the substrate W and the outer cup 1220 when the substrate W is loaded onto or unloaded from the support plate 1420. Furthermore, when a process is performed, the support plate 1420 is located in a lower position than the upper end of the outer cup 1220 such that the substrate W is located in the treating space.

The exhaust unit 2900 exhausts an air flow 84 in a treating space. The exhaust unit 2900 has a separate exhaust pipe 2820 and an air flow guide duct 2700.

The separate exhaust pipe 2820 is connected with an exhaust space 1248 in the substrate treating apparatus 2000. One or more separate exhaust pipes 2820 may be provided. According to an embodiment, the separate exhaust pipe 2820 is connected to a bottom wall 1222 of an outer cup 1220, and an inlet of the separate exhaust pipe 2820 is located to be spaced apart upward from the bottom wall 1222 of the outer cup 1220 by a predetermined height.

The air flow guide duct 2700 guides the air flow 84 at a height equal to or substantially equal to the height of an upper surface of a substrate W supported on a substrate support unit 1400 or at a height adjacent to the height of the upper surface of the substrate W. When the substrate W rotates, the downward air flow 84 supplied to an upper region of the substrate W flows from a central region of the substrate W toward an edge region of the substrate W by the centrifugal force. Furthermore, on the surface of the substrate W and in a region adjacent thereto, the air flow 84 flows toward the outside of the substrate W while curving in the same direction as the rotating direction of the substrate W. When the air flow 84 deviates from the upper surface of the substrate W, the direction of the air flow 84 is tangential to the rotating direction of the substrate W.

The air flow guide duct 2700 is provided such that the air flow 84 deviating from the upper surface of the substrate W is introduced into the air flow guide duct 2700 in a tangential direction with respect to the rotating direction of the substrate W.

The air flow guide duct 2700 may be disposed between the outer cup 1220 and an inner cup 1240. The air flow guide duct 2700 may be disposed closer to the outer cup 1220 than to the inner cup 1240. According to an embodiment, the air flow guide duct 2700 may be provided on an inner wall 1242 of the outer cup 1220. A path through which the air flow 84 flows is provided between the air flow guide duct 2700 and an outer wall 1244 of the inner cup 1240, and part of the air flow 84 may flow through the path between air flow guide duct 2700 and an outer wall 1244 of the inner cup 1240. The air flow guide duct 2700 has an inlet 2746a and an outlet 2746b. The inlet 2746a is provided at the same position as the substrate W supported on the substrate support unit 1400, or at a position adjacent to the substrate W supported on the substrate support unit 1400. The outlet 2746b may be connected with an integrated exhaust pipe 2840 to be described below.

According to an embodiment, the air flow guide duct 2700 has a tubular shape. The lengthwise direction of the air flow guide duct 2700 may be perpendicular to the bottom wall 1222 of the outer cup 1220. The air flow guide duct 2700 has an upper wall 2720 and a sidewall 2740. The sidewall 2740 has a first side surface 2742 facing the inside surface of the outer cup 1220, a second side surface 2744 facing toward the substrate W placed on the substrate support unit 1400, and a third side surface 2746 facing a tangential direction with respect to the rotating direction of the substrate W. The upper wall 2720 of the air flow guide duct 2700 serves as a blocking face. The first side surface 2742 and the second side surface 2744 of the sidewall 2740 of the air flow guide duct 2700 serve as blocking faces. The inlet 2746a of the air flow guide duct 2700 is formed in the third side surface 2746, and the portion of the third side surface 2746 other than the inlet 2746a serves as a blocking face. The air flow guide duct 2700 may have a constant cross-section along a direction perpendicular to the lengthwise direction thereof. Furthermore, the distance between the second side surface 2744 of the sidewall 2740 of the air flow guide duct 2700 and a rotary shaft 1440 of the substrate support unit 1400 may be increased farther away from the inlet 2746a. Accordingly, when viewed from above, the air flow guide duct 2700 may have a gradually deceasing area farther away from the inlet 2746a. The inlet 2746a may be formed in an upper portion of the first side surface 2742. The inlet 2746a may have a rectangular shape.

One or more air flow guide ducts 2700 may be provided. According to an embodiment, four air flow guide ducts 2700 may be provided. The four air flow guide ducts 2700 may be provided at equal intervals with respect to the center of rotation of the substrate W. The air flow guide ducts 2700 may be spaced apart from each other while defining a circular.

An integrated exhaust pipe 2840 is disposed outside the outer cup 1220. According to an embodiment, the integrated exhaust pipe 2840 may be disposed outside the housing 1100. The integrated exhaust pipe 2840 has an air flow introduction part 2842 and an air flow discharge part 2844.

The air flow introduction part 2842 has a ring shape. The separate exhaust pipe 2820 and the air flow guide duct 2700 are coupled with the air flow introduction part 2842, and gas flowing out of the separate exhaust pipe 2820 and the air flow guide duct 2700 is introduced into the air flow introduction part 2842 of the integrated exhaust pipe 2848. The air flow discharge part 2844 is located in a space surrounded by the air flow introduction part 2842. The integrated exhaust pipe 2840 has an external duct 2849 coupled with the air flow discharge part 2844, and a pressure controlling member (not shown), such as a pump, may be coupled to the external duct 2849.

The separate exhaust pipe 2820 is coupled to the air flow introduction part 2842 at a position closer to the air flow discharge part 2844 than to the air flow guide duct 2700. A gas-liquid separator 2846 may be provided between the point where the separate exhaust pipe 2820 is connected to the air flow introduction part 2842 and the air flow discharge part 2844. According to an embodiment, the gas-liquid separator 2846 may be provided in the air flow introduction part 2842. The gas-liquid separator 2846 has a ring shape and protrudes upward from the bottom surface of the air flow introduction part 2842. Furthermore, the gas-liquid separator 2846 is spaced apart from the upper surface of the air flow introduction part 2842.

A drain pipe 2848 is provided on the opposite side to the air flow discharge part 2844 with respect to the point where the gas-liquid separator 2846 is installed in the air flow introduction part 2842. The drain pipe 2848 discharges, outside the integrated exhaust pipe 2848, a liquid separated from the air flow 84 introduced into the air flow introduction part 2842. According to an embodiment, the drain pipe 2848 is provided at a position adjacent to the gas-liquid separator 2846.

Figure 13:
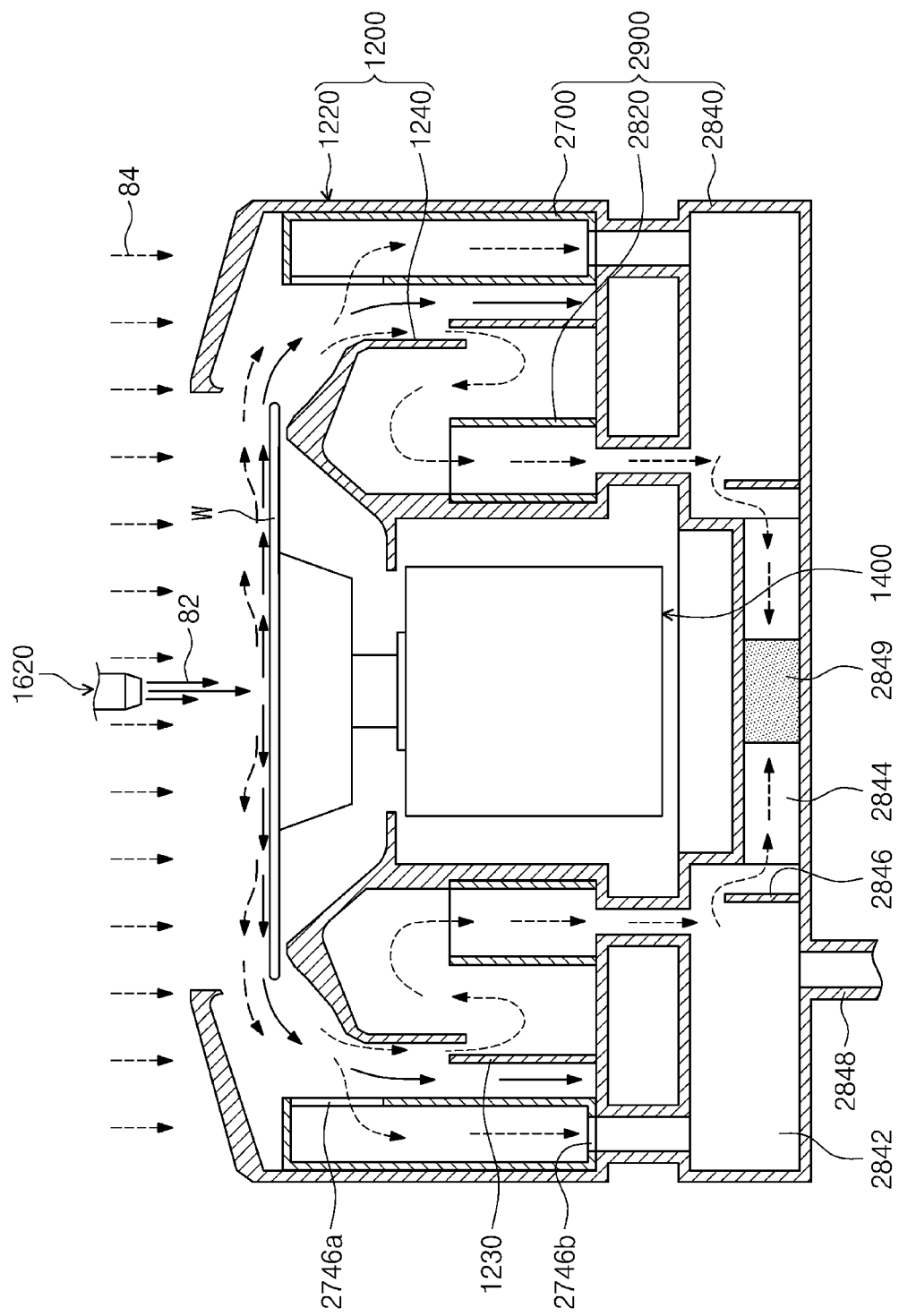
FIG. 13 and FIG. 14 are a sectional view and a sectional perspective view illustrating flow paths of an air flow and a treating liquid when a substrate is subjected to liquid treatment through the apparatus of FIG. 11.
Figure 14:
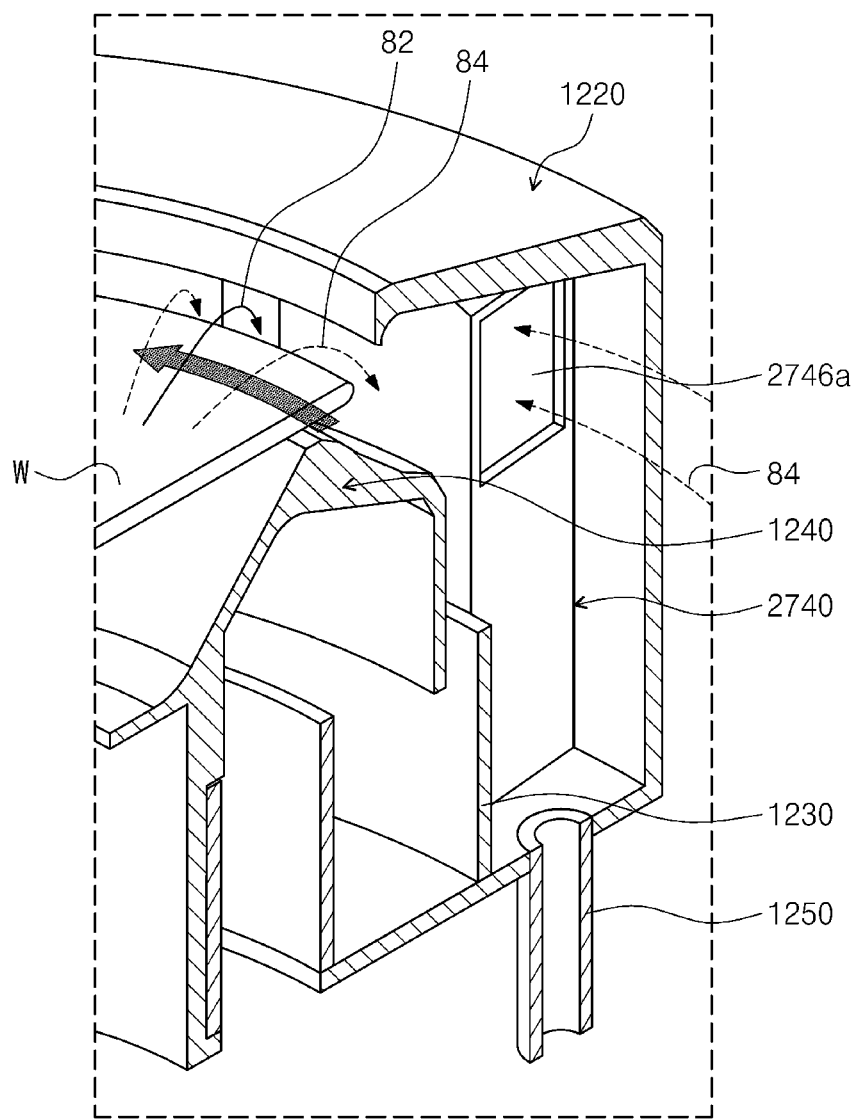

FIG. 13 and FIG. 14 are a sectional view and a sectional perspective view illustrating flow paths of the air flow 84 and the treating liquid 82 when the substrate W is subjected to liquid treatment through the apparatus of FIG. 10.

Referring to FIG. 13 and FIG. 14, in a coating process, the substrate W is supported on the support plate 1420 and is rotated by the support plate 1420. At this time, the substrate support unit 1400 rotates the substrate W such that the air flow 84 generated by the rotation of the substrate W flows toward the inlet 2746a of the air flow guide duct 2700. Outside air is supplied as the downward air flow 84 from the fan filter unit 1260 toward the substrate W. Furthermore, the treating liquid 82 is dispensed onto the substrate W from the nozzle 1620. Due to the rotation of the substrate W, the air flow 84 on the upper surface of the substrate W flows toward the outside of the substrate W while curving in the rotating direction of the substrate W. When the air flow 84 flows toward the outside of the substrate W, part of the air flow 84 is introduced into the air flow guide duct 2700 and thereafter released outside the processing container 1200. Furthermore, the rest of the air flow 84 flows downward through a gap between the inner cup 1240 and the outer cup 1220. Thereafter, the rest of the air flow 84 is introduced into the exhaust space 1248 in the processing container 1200 and released outside the processing container 1200 through the separate exhaust pipe 2820. In addition, the treating liquid 82 used to treat the substrate W is introduced into the space between the inner cup 1240 and the outer cup 1220 and thereafter drained outside the processing container 1200 through the drain pipe 1250.

The air flow 84 released from the air flow guide duct 2700 and the separate exhaust pipe 2820 is introduced into the air flow introduction part 2842 of the integrated exhaust pipe 2840. Thereafter, the treating liquid 82 is separated by the gas-liquid separator 1230, and the air flow 84 is released to the outside through the air flow discharge part 2844.

According to the embodiment of FIG. 10, part of the air flow 84 is introduced into the air flow guide duct 2700. At this time, the air flow 84 flowing toward the outside of the substrate W by the centrifugal force may be smoothly introduced into the air flow guide duct 2700 without collision or interference with the processing container 1200 or components thereof because the air flow guide duct 2700 is provided such that the air flow 84 is introduced into the air flow guide duct 2700 in the tangential direction with respect to the rotating direction of the substrate W.

Furthermore, part of the air flow 84 is introduced into the exhaust space 1248 in the processing container 1200. However, the amount of air flow 84 introduced into the exhaust space 1248 is very small, as compared with when the air flow guide duct 2700 is not provided. Thus, the air flow 84 may be smoothly released through the exhaust space 1248 without a vortex or a big collision.

In the above-described embodiment, it has been described that the air flow 84 supplied to the substrate W flows into the exhaust space 1248, which is located under the support plate 1420, along the first path and flows into the air flow guide duct 2700 along the second path. However, the substrate treating apparatus 2000 may be configured such that all of the air flow 84 supplied to the substrate W flows along only the second path.

Hereinafter, a substrate treating apparatus 3000 according to a second embodiment of the inventive concept will be described in more detail with reference to figures.

Figure 15:
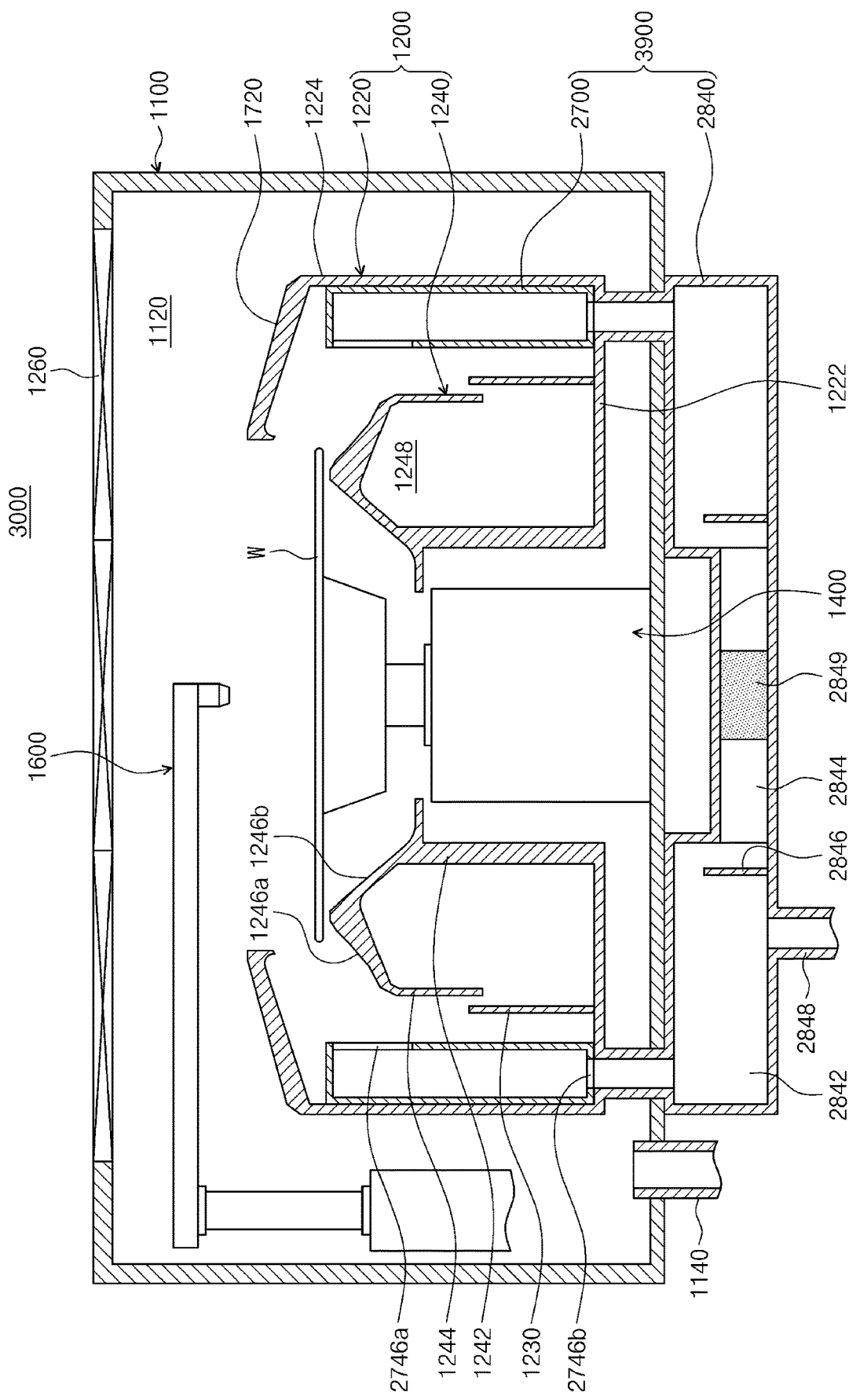
FIG. 15 is a schematic sectional view illustrating a structure of a substrate treating apparatus for treating a substrate by supplying a liquid onto the rotating substrate according to a second embodiment of the inventive concept.
Figure 16:
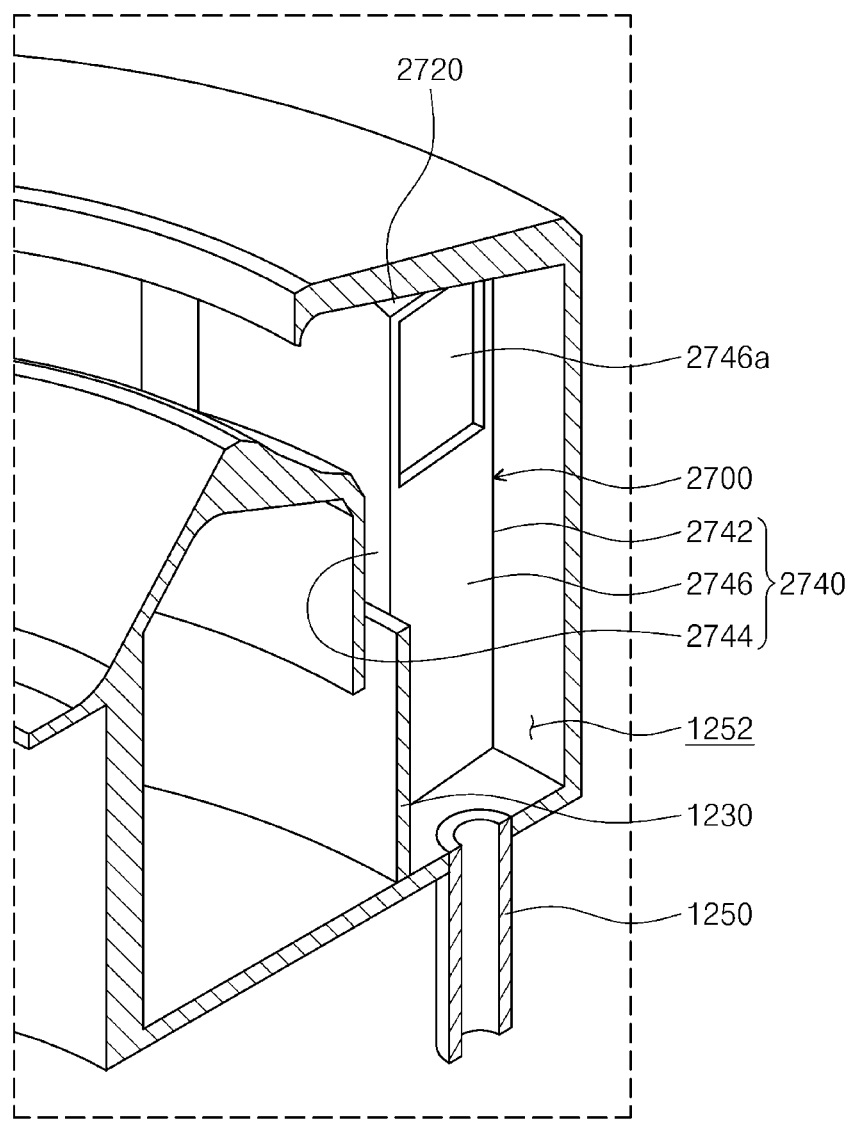
FIG. 16 is a sectional perspective view of the apparatus of FIG. 15.
Figure 17:
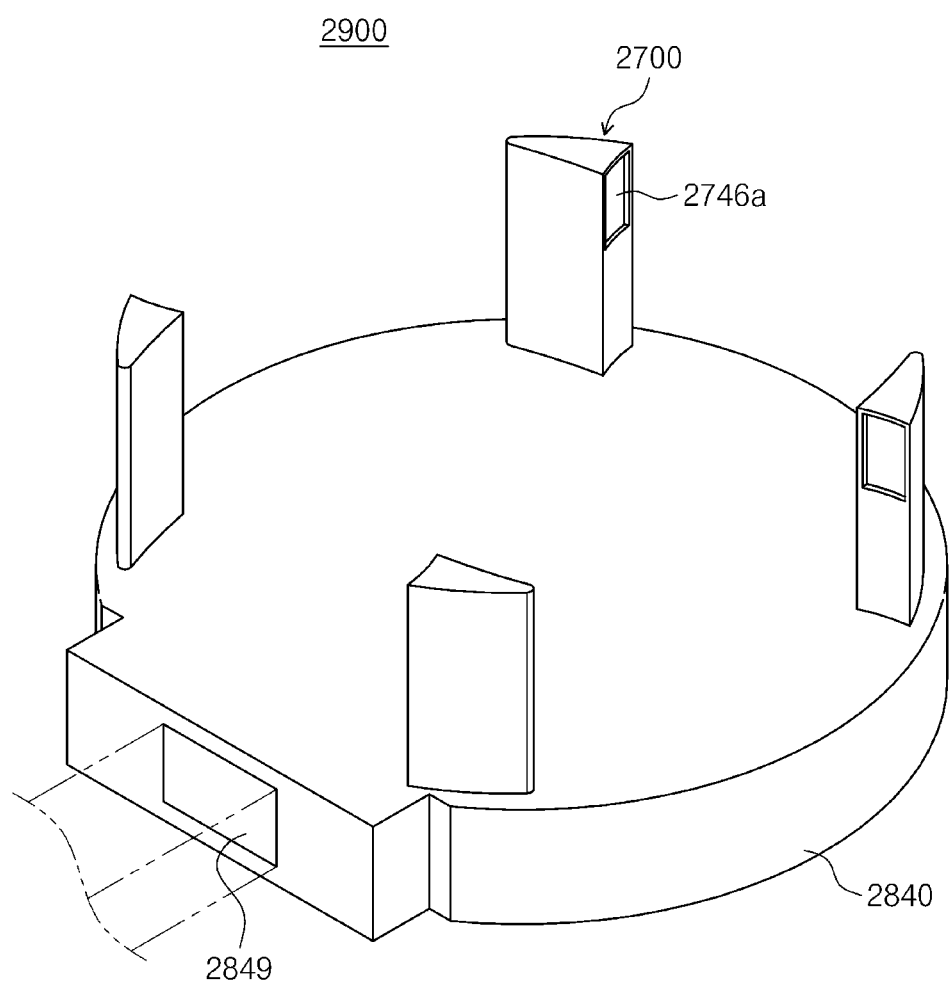
FIG. 17 is a schematic perspective view illustrating a structure of an exhaust unit in the apparatus of FIG. 15.

FIG. 15 is a cross-sectional view schematically showing a structure of a substrate processing apparatus for processing a substrate by supplying a liquid to a rotating substrate according to a second embodiment of the inventive concept, FIG. 16 is a perspective view illustrating a partial cut of the apparatus of FIG. 15, and FIG. 17 is a perspective view schematically showing a structure of an exhaust unit of FIG. 15.

In the first embodiment, it was described that the air flow 84 supplied to the substrate W flows into the first path along the exhaust space 1248 located below the support plate 1420 of the processing space, and the second path along the air flow guide duct 2700. Alternatively, in the substrate processing apparatus 2000 according to the second embodiment, all of the air flow 84 supplied to the substrate W is provided to flow only through the second path.

Specifically, the substrate processing apparatus 3000 according to the second embodiment is different from the substrate processing apparatus 2000 of the first embodiment in aspect of the exhaust unit 2700, and all other configurations are the same. Specifically, the substrate processing apparatus 3000 according to the second embodiment removes separate exhaust pipes 2820 from the exhaust unit 2700 of the substrate processing apparatus 2000 according to the first embodiment, and includes only an air flow guide duct 2700 and an integrated exhaust pipe 2940 to exhaust air flow 84 in the processing space. Hereinafter, the same reference numerals are assigned to the same configuration as the substrate processing apparatus 2000 according to the first embodiment, and a description thereof will be omitted.

Referring to FIG. 15, a substrate processing apparatus 3000 according to the second embodiment includes an exhaust unit 3900. The exhaust unit 3900 exhausts the air flow 84 in the processing space. The exhaust unit 3900 includes an air flow guide duct 2700 and an integrated exhaust pipe 2840.

The air flow guide duct 2700 guides the air flow 84 at a height equal to or substantially equal to the height of an upper surface of a substrate W supported on a substrate support unit 1400 or at a height adjacent to the upper surface of the substrate W. When the substrate W rotates, the downward air flow 84 supplied to an upper region of the substrate W flows from a central region of the substrate W toward an edge region of the substrate W by the centrifugal force. Furthermore, on the surface of the substrate W and in a region adjacent thereto, the air flow 84 flows toward the outside of the substrate W while curving in the same direction as the rotating direction of the substrate W. When the air flow 84 deviates from the upper surface of the substrate W, the direction of the air flow 84 is tangential to the rotating direction of the substrate W.

The air flow guide duct 2700 is provided such that the air flow 84 deviating from the upper surface of the substrate W is introduced in a tangential direction to the rotating direction of the substrate W.

The air flow guide duct 2700 may be disposed between the outer cup 1220 and the inner cup 1240. The air flow guide duct 2700 may be disposed closer to the outer cup 1220 than to the inner cup 1240. In an embodiment, the air flow guide duct 2700 may be installed on the inner wall 1242 of the outer cup 1220. The air flow guide duct 2700 has an inlet 2746a and an outlet 2746b. The inlet 2746a is provided at the same or adjacent position as the substrate W supported by the support unit 1400. The outlet 2746b may be provided to be connected to an integrated exhaust pipe 2840 to be described later.

In an embodiment, the air flow guide duct 2700 has a tubular shape. The air flow guide duct 2700 may be provided with its' length provided along a direction perpendicular to the bottom wall 1222 of the outer cup 1220. The air flow guide duct 2700 has an upper wall 2720 and a sidewall 2740. The side wall 2740 has a first side surface 2742 facing the inner surface of the outer cup 1220, a second side surface 2744 facing the substrate W placed on the support unit 1400, and a third side surface 2746 facing the tangent direction to the rotating direction of the substrate W. The upper wall 2720 of the air flow guide duct 2700 is serves as a blocking face. The first side surface 2742 and the second side surface 2744 of the sidewall 2740 of the air flow guide duct 2700 serve as blocking faces. The inlet 2746a of the air flow guide duct 2700 is formed on the third side surface 2746, and a portion of the third side surface 2746 except for the inlet 2746a serve as a blocking face. The air flow guide duct 2700 may be provided to have the cross-sectional area perpendicular to the length of the air flow guide duct 2700. Furthermore, the second side surface 2744 of the sidewall 2740 of the air flow guide duct 2700 may be provided further away from the rotary shaft 1440 of the support unit 1400 as the distance from the inlet 2746a increases. Accordingly, the air flow guide duct 2700 may be provided to have a narrower area as it moves away from the inlet 2746a when viewed from the top. The inlet 2746a may be provided in an upper portion of the first side surface 2742. The inlet 2746a may be provided in a rectangular shape.

One or more air flow guide ducts 2700 may be provided. According to an embodiment, four air flow guide ducts 2700 may be provided. The four air flow guide ducts 2700 may be spaced apart from each other at equal intervals with respect to the center of rotation of the substrate W.

The integrated exhaust pipe 2840 is disposed outside the outer cup 1220. According to an embodiment, the integrated exhaust pipe 2840 may be disposed outside the housing 1100. The integrated exhaust pipe 2840 has an air flow introduction part 2842 and an air flow discharge part 2844.

The air flow introduction part 2842 has a ring shape. The air flow guide duct 2700 is coupled to the air flow introduction part 2842, and gas discharged from the separate exhaust pipe 2820 and the air flow guide duct 2700 flows into the air flow introduction part 2842 of the integrated exhaust pipe 2840. The air flow discharge unit 2844 is located in a space surrounded by the air flow introduction part 2842. The integrated exhaust pipe 2840 has an external duct 2849 coupled to the air flow discharge unit 2844, and a pressure controlling member (not shown) such as a pump may be coupled to the external duct 2849.

A gas-liquid separator 2846 may be provided between a point where the air flow guide duct 2700 is connected to the air flow introduction part 2842 and the air flow discharge part 2844. According to an embodiment, the gas-liquid separator 2846 may be installed in the air flow introduction part 2842. The gas-liquid separator 2846 is provided in a ring shape and protrudes upward from the bottom surface of the air flow introduction part 2842. In addition, the gas-liquid separator 2846 is provided to be spaced apart from the upper surface of the air flow introduction part 2842.

A drain pipe 2848 is provided facing the air flow discharge part 2844 with respect to the point where the gas-liquid separator 2846 is installed in the air flow introduction part 2842. The drain pipe 2848 drains to the outside of the integrated exhaust pipe 2840 a liquid separated from the air flow 84 introduced into the air flow introduction part 2842. According to an embodiment, the drain pipe 2848 is provided at a position adjacent to the gas-liquid separator 2846.

Figure 18:
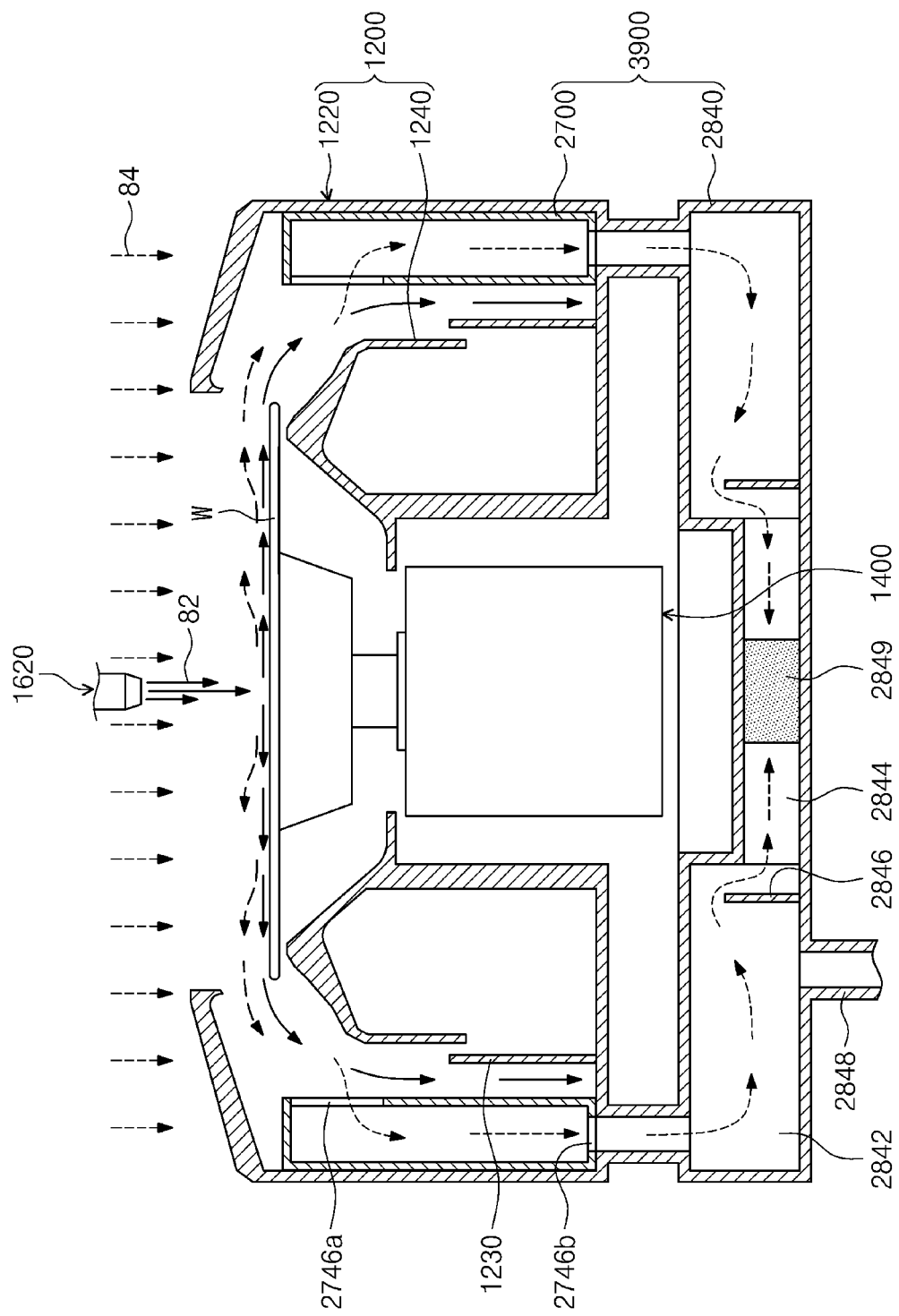
FIG. 18 and FIG. 19 are a sectional view illustrating flow paths of an air flow and a treating liquid when a substrate is subjected to liquid treatment through the apparatus of FIG. 15.
Figure 19:
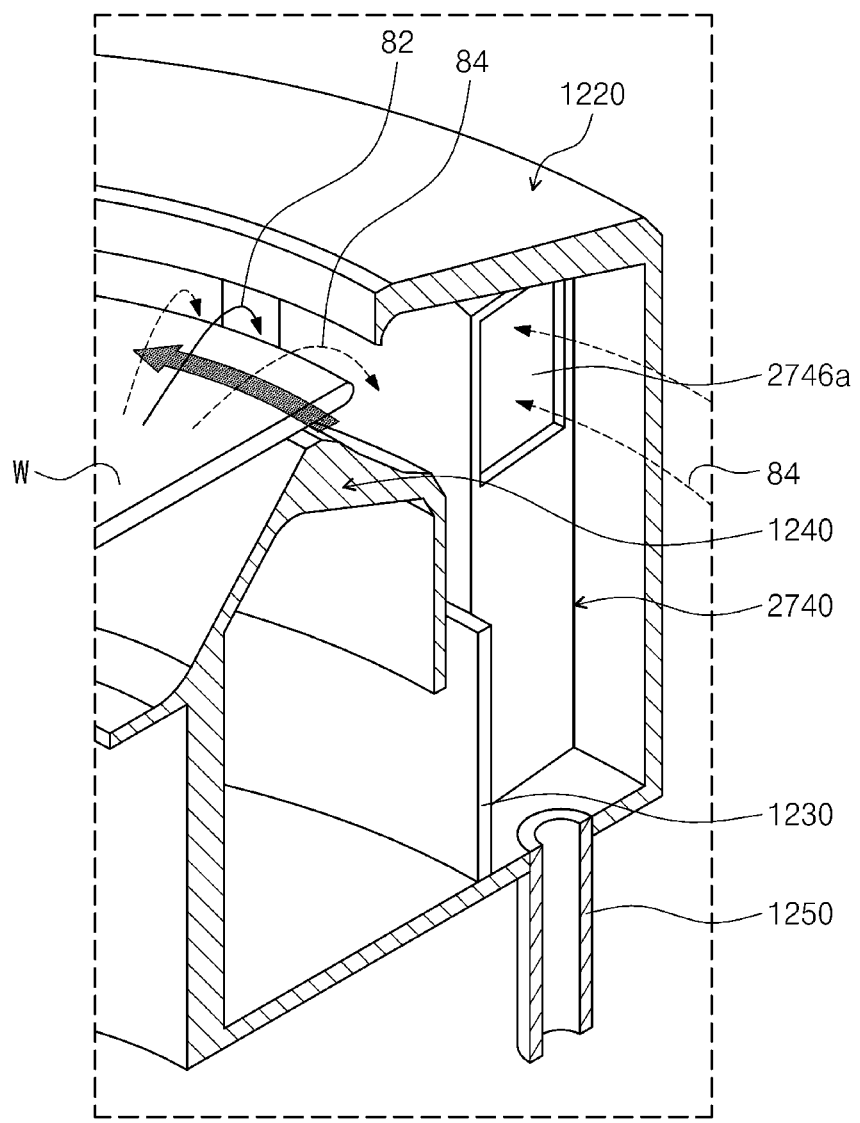

FIG. 18 and FIG. 19 are sectional views illustrating flow paths of an air flow and a treating liquid when a substrate is subjected to liquid treatment through the apparatus of FIG. 15.

Referring to FIG. 17, in a coating process, the substrate W is supported on the support plate 1420 and is rotated by the support plate 1420. At this time, the substrate support unit 1400 rotates the substrate W such that the air flow 84 generated by the rotation of the substrate W flows toward the inlet 2746a of the air flow guide duct 2700. Outside air is supplied as the downward air flow 84 from the fan filter unit 1260 toward the substrate W. Furthermore, the treating liquid 82 is dispensed onto the substrate W from the nozzle 1620. Due to the rotation of the substrate W, the air flow 84 on the upper surface of the substrate W flows toward the outside of the substrate W while turning to the rotating direction of the substrate W. When the air flow 84 flows toward the outside of the substrate W, most of the air flow 84 is introduced into the air flow guide duct 2700 and thereafter released to outside the processing container 1200.

The air flow 84 released from the air flow guide duct 2700 is introduced into the air flow introduction part 2842 of the integrated exhaust pipe 2840. Thereafter, the treating liquid 82 is separated by the gas-liquid separator 2846, and the air flow 84 is released to the outside through the air flow discharge part 2844.

Most of the air flow 84 is introduced into the air flow guide duct 2700. At this time, the air flow 84 flowing toward the outside of the substrate W by the centrifugal force may be smoothly introduced into the air flow guide duct 2700 without collision or interference with the processing container 1200 or components thereof because the air flow guide duct 2700 is provided such that the air flow 84 is introduced into the air flow guide duct 2700 in the tangential direction with respect to the rotating direction of the substrate W.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a processing container having an inner space;
   a support unit configured to support and rotate the substrate in the inner space;
   a liquid supply unit configured to supply a treating liquid to the substrate supported by the support unit; and
   an exhaust unit configured to exhaust an air flow from the inner space,
   wherein the exhaust unit includes an air flow guide duct with an inlet provided to introduce the air flow into the air flow guide duct in a tangential direction to a rotating direction of the substrate supported on the support unit,
   wherein the processing container comprises:
   an outer cup configured to provide the inner space; and
   an inner cup disposed in the inner space so as to be spaced apart from the outer cup,
   wherein the air flow guide duct is provided between the outer cup and the inner cup,
   wherein the air flow guide duct comprises an upper wall and a sidewall, and the inlet is formed on the sidewall.

2. The apparatus of claim 1, wherein the air flow guide duct is provided in plural with being spaced apart from each other along a circumferential direction of the substrate supported by the support unit.

3. The apparatus of claim 1, wherein the air flow guide duct is installed at an inner wall of the outer cup.

4. The apparatus of claim 3, wherein the sidewall comprises:
   a first side face adjacent an inner face of the outer cup;
   a second side face adjacent the substrate placed on the support unit; and
   a third side surface facing the tangent direction to the rotating direction of the substrate, and
   the inlet is formed at the third side surface.

5. The apparatus of claim 4, wherein the second side surface extends from the second side face and away from a rotation axis of the support unit as it moves away from the inlet.

6. The apparatus of claim 1, wherein the support unit comprises:

a support plate configured to support the substrate;
a rotary shaft configured to rotate the support plate; and
an actuator coupled to the rotary shaft and configured to provide torque to the rotary shaft,
wherein
the inner cup is configured to surround the rotary shaft or the actuator.

7. The apparatus of claim 6, wherein a length of the air flow guide duct extends vertically.

8. The apparatus of claim 6, wherein the upper wall serves as a blocking face, and among the side wall the inlet is provided at a wall facing a direction parallel to a tangent line of the substrate supported by the support unit, and the remaining face may serve as a blocking face.

9. The apparatus of claim 6, wherein the inner cup defines an exhaust space under the support plate, and the exhaust unit further includes an individual exhaust pipe for exhausting an air flow introduced into the exhaust space to the outside of the inner space.

10. The apparatus of claim 9, wherein the exhaust unit further includes an integrated exhaust pipe located outside the processing container and provided with a pressure controlling member, and the individual exhaust pipe and the air flow guide duct are connected to the integrated exhaust pipe.

11. The apparatus of claim 1, further comprising:
a liquid supply nozzle for supplying a photoresist to the substrate supported by the support unit.

* * * * *